(12) United States Patent
Allen et al.

(10) Patent No.: US 7,030,378 B2
(45) Date of Patent: Apr. 18, 2006

(54) REAL-TIME RADIATION SENSOR CALIBRATION

(75) Inventors: Thomas P. Allen, Allston, MA (US); Neal R. Butler, Acton, MA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 10/634,215

(22) Filed: Aug. 5, 2003

(65) Prior Publication Data

US 2005/0029453 A1 Feb. 10, 2005

(51) Int. Cl.
*G01J 5/00* (2006.01)
*H01L 25/00* (2006.01)

(52) U.S. Cl. .................................. 250/332; 250/252.1

(58) Field of Classification Search ............. 250/252.1, 250/330, 332, 338.1, 338.3, 338.4, 339.02, 250/339.03, 339.04, 339.09, 341.5, 351, 250/353
See application file for complete search history.

(56) References Cited

U.S. PATENT DOCUMENTS

| | | |
|---|---|---|
| 3,621,258 A | 11/1971 | Dreitzler |
| 3,665,190 A | 5/1972 | Kotera et al. |
| 3,891,843 A | 6/1975 | Parkin |
| 3,961,325 A | 6/1976 | Kendall et al. |
| 3,971,015 A | 7/1976 | Hornak |
| 3,973,146 A | 8/1976 | Arnold et al. |
| 4,176,398 A | 11/1979 | Rider |
| 4,276,474 A | 6/1981 | Crawford |
| 4,298,887 A | 11/1981 | Rode |
| 4,369,463 A | 1/1983 | Anastassiou et al. |
| 4,380,755 A | 4/1983 | Endlicher et al. |
| 4,513,390 A | 4/1985 | Walter et al. |
| 4,587,426 A | 5/1986 | Munier et al. |
| 4,589,024 A | 5/1986 | Koch et al. |
| 4,609,824 A | 9/1986 | Munier et al. |
| 4,628,364 A | 12/1986 | Koch |
| 4,652,766 A | 3/1987 | Wang et al. |

(Continued)

FOREIGN PATENT DOCUMENTS

EP   0 534 769 A2   3/1993

(Continued)

OTHER PUBLICATIONS

N. Butler et al., "Low Cost Uncooled Microbolometer Imaging System for Dual Use," Jul. 12, 1995, Presented at SPIE, San Diego, CA.

(Continued)

*Primary Examiner*—Albert Gagliardi
(74) *Attorney, Agent, or Firm*—Wolf, Greenfield, & Sacks, P.C.

(57) ABSTRACT

One embodiment of the invention is directed to methods and apparatus for determining a variation of a calibration parameter of a pixel of the thermal sensor during operation of the imaging apparatus, after an initial calibration procedure. Another embodiment of the invention is directed to methods and apparatus for calculating a gain calibration parameter using first and second ambient temperature values and respective first and second resistance values for a pixel of a sensor. A further embodiment of the invention is directed to calculating an offset calibration parameter for at least one pixel using a gain of the at least one pixel between first and second times and an ambient temperature at a third time, wherein the pixel is exposed to both scene and ambient radiation at the third time.

53 Claims, 13 Drawing Sheets

U.S. PATENT DOCUMENTS

| | | | |
|---|---|---|---|
| 4,654,622 A | 3/1987 | Foss et al. | |
| 4,659,928 A | 4/1987 | Tew | |
| 4,679,068 A | 7/1987 | Lillquist et al. | |
| 4,684,812 A | 8/1987 | Tew et al. | |
| 4,686,373 A | 8/1987 | Tew et al. | |
| 4,739,409 A | 4/1988 | Baumeister | |
| 4,745,278 A | 5/1988 | Hanson | |
| 4,752,694 A | 6/1988 | Hegel, Jr. et al. | |
| 4,754,139 A | 6/1988 | Ennulat et al. | |
| 4,792,661 A | 12/1988 | Schmidtchen et al. | |
| 4,792,681 A | 12/1988 | Hanson | |
| 4,808,822 A | 2/1989 | Manning et al. | |
| 4,831,257 A | 5/1989 | McClelland et al. | |
| 4,879,598 A | 11/1989 | Seto | |
| 4,902,895 A | 2/1990 | Hanson | |
| 4,922,116 A | 5/1990 | Grinberg et al. | |
| 4,935,629 A | 6/1990 | Livermore et al. | |
| 4,956,686 A | 9/1990 | Borrello et al. | |
| 4,967,082 A | 10/1990 | Cooke et al. | |
| 4,991,109 A | 2/1991 | Crookshanks | |
| 4,991,127 A | 2/1991 | Crookshanks | |
| 5,010,251 A | 4/1991 | Grinberg et al. | |
| 5,021,663 A | 6/1991 | Hornbeck | |
| 5,045,685 A | 9/1991 | Wall | |
| 5,084,704 A | 1/1992 | Parrish | |
| 5,129,595 A | 7/1992 | Thiede et al. | |
| 5,134,474 A | 7/1992 | Hanafusa et al. | |
| 5,166,810 A | 11/1992 | Sorimachi et al. | |
| 5,175,802 A | 12/1992 | Crookshanks | |
| 5,185,883 A | 2/1993 | Ianni et al. | |
| 5,200,623 A | 4/1993 | Cannata | |
| 5,201,582 A | 4/1993 | Lesniak | |
| 5,204,761 A | 4/1993 | Gusmano | |
| 5,216,510 A | 6/1993 | Amingual et al. | |
| 5,268,576 A | 12/1993 | Dudley | |
| 5,288,649 A | 2/1994 | Keenan | |
| 5,300,915 A | 4/1994 | Higashi et al. | |
| 5,326,726 A | 7/1994 | Tsang et al. | |
| 5,367,167 A | 11/1994 | Keenan | |
| 5,369,280 A | 11/1994 | Liddiard | |
| 5,389,788 A | 2/1995 | Grinberg et al. | |
| 5,399,889 A | 3/1995 | Miyake et al. | |
| 5,420,419 A | 5/1995 | Wood | |
| 5,442,176 A | 8/1995 | Eckel, Jr. et al. | |
| 5,446,284 A | 8/1995 | Butler et al. | |
| 5,486,698 A | 1/1996 | Hanson et al. | |
| 5,489,776 A | 2/1996 | Lung | |
| 5,512,748 A | 4/1996 | Hanson | |
| 5,532,484 A | 7/1996 | Sweetser et al. | |
| 5,541,412 A | 7/1996 | Tanaka et al. | |
| 5,554,849 A | 9/1996 | Gates | |
| 5,559,332 A | 9/1996 | Meissner et al. | |
| 5,563,405 A | 10/1996 | Woolaway, II et al. | |
| 5,572,029 A | 11/1996 | Walker et al. | |
| 5,578,826 A | 11/1996 | Walker et al. | |
| 5,591,973 A | 1/1997 | Masarik et al. | |
| 5,600,369 A | 2/1997 | Cazaux et al. | |
| 5,650,622 A | 7/1997 | Ookawa et al. | |
| 5,656,848 A | 8/1997 | Beratan et al. | |
| 5,682,035 A | 10/1997 | Gallagher et al. | |
| 5,698,852 A | 12/1997 | Tanaka et al. | |
| 5,756,999 A | 5/1998 | Parrish et al. | |
| 5,760,398 A | 6/1998 | Blackwell et al. | |
| 5,763,885 A | 6/1998 | Murphy et al. | |
| 5,811,815 A | 9/1998 | Marshall et al. | |
| 5,925,875 A | 7/1999 | Frey | |
| 6,028,309 A | 2/2000 | Parrish et al. | |
| 6,157,404 A | 12/2000 | Marshall et al. | |
| 6,225,937 B1 | 5/2001 | Butler | |
| 6,230,108 B1 * | 5/2001 | Matsuda | 702/99 |
| 6,249,002 B1 | 6/2001 | Butler | |
| 6,274,869 B1 | 8/2001 | Butler | |
| 6,433,333 B1 | 8/2002 | Howard | |
| 6,465,785 B1 * | 10/2002 | McManus | 250/338.1 |
| 6,515,285 B1 | 2/2003 | Butler et al. | |
| 6,730,909 B1 * | 5/2004 | Butler | 250/338.1 |
| 2001/0040216 A1 | 11/2001 | Knauth et al. | |
| 2001/0045516 A1 | 11/2001 | Emanuel et al. | |
| 2005/0029453 A1 * | 2/2005 | Allen et al. | 250/332 |

FOREIGN PATENT DOCUMENTS

| | | |
|---|---|---|
| FR | 2 554 999 A1 | 5/1985 |
| GB | 2 202 702 A | 9/1988 |
| WO | WO 90/16082 | 12/1990 |
| WO | WO 92/06561 | 4/1992 |
| WO | WO 93/09414 | 5/1993 |
| WO | WO 93/18492 | 9/1993 |
| WO | WO 93/26050 | 12/1993 |
| WO | WO 94/00950 | 1/1994 |
| WO | WO 98/35212 | 8/1998 |
| WO | WO 200184118 A2 * | 11/2001 |

OTHER PUBLICATIONS

N. Butler et al., "Advanced Microbolometer Digital Output Focal Plane Array," Jul. 1996, Lockheed Martin IR Imaging Sytems Internal Government Research Report.

C. Marshall et al., "Uncooled Microbolometer Imaging Sensors", Jul. 1996, Lockheed Martin IR Imaging Systems Internal Government Research Report.

W.T. Holman, "A Compact Low Noise Operational Amplifier for a 1.2 μm Digital CMOS Technology," Jun. 30, 1995, pp. 710-714, IEEE Journal of Solid-State Circuits, vol. 30, No. 6.

O.B. Milgrome et al., "A 12 Bit Analog to Digital Converter for VLSI Applications in Nuclear Science," 1992, pp. 771-775, IEEE Transactions on Nuclear Science, vol. 39, No. 4.

O.B. Milgrome et al., "A Monolithic CMOS 16 Channel, 12 Bit, 10 Microsecond Analog to Digital Integrated Circuit," Aug. 1993, pp. 721-723, IEEE Transactions on Nuclear Science, vol. 40, No. 4.

Abstract of foreign patent No. EPA-0324925, Jul. 26, 1989, Mitsubishi Denki.

Abstract of foreign patent No. JP 57-124726, Aug. 3, 1982, Mitsubishi Denki.

Abstract of foreign patent No. JP 3-179977, Aug. 5, 1991, Mitsubishi Elec. Corp.

Abstract of foreign patent No. JP 6-86174, Mar. 25, 1994, NEC Corp.

Abstract of foreign patent No. JP 3-289777, Dec. 19, 1991, NEC Corp.

* cited by examiner

REAL-TIME RADIATION SENSOR CALIBRATION

BACKGROUND OF THE INVENTION

1. Field of the Invention

The present invention generally relates to radiation sensors, and in particular, to compensating operating parameters and/or output signals of radiation sensors for changes in temperature of the sensors.

2. Discussion of the Related Art

A radiation detector is a device that produces an output signal which is a function of an amount of radiation that is incident upon an active region of the radiation detector. Radiation detectors may be designed and constructed to be sensitive to particular regions of the electromagnetic spectrum. For example, infrared detectors are radiation detectors that are sensitive to radiation in the infrared region of the electromagnetic spectrum. One example of an infrared detector includes a thermal detector, which detects radiation based upon a change in the temperature of an active region of the detector due to absorption of radiation incident to the detector.

A variety of imaging sensors may be constructed using an array of radiation detectors. Such sensors may be used in an imaging system that produces an image (e.g., on a display) based on radiation impinging on the imaging sensor. Based on the type of detectors used, the imaging sensor may be responsive to a particular region of spectrum. For example, an infrared or thermal imaging sensor may include a number of thermal detectors that detect a representation of an object by the objects' thermal emissions. In particular, energy emitted by an object may depend on numerous quantities such as, for example, the emissivity and the temperature of the object. Infrared thermal sensors typically detect one or both of these quantities and use the detected information to produce an object image that may be viewed, for example, on a display.

One issue in connection with at least some types of radiation detectors is that often it may be challenging to separate those signals output by the detector that are actually due to radiation of interest incident to the detector from various undesirable components which may be present in the detector output signals. For example, detector output signals may include various undesirable components due to variations in temperature of the detector itself that are not necessarily due to the radiation of interest. In particular, temperature changes in the vicinity of the detector that may affect the temperature of the detector, sometimes referred to as ambient temperature variations (e.g., changes in temperature of a substrate on which the detector is fabricated, changes in temperature of a package in which the detector is housed, average temperature changes in a scene of interest itself), in turn may cause undesirable components to be present in the detector output signals. In some cases, these undesirable components may be hundreds of times larger than the instantaneous signals resulting from the radiation of interest, thereby detrimentally reducing the dynamic range of the detector and/or processing circuitry associated with the detector with respect to the radiation of interest.

In view of the foregoing, some conventional imaging systems employing imaging sensors comprising a number (e.g., array) of radiation detectors require some type of temperature stabilization of the detectors to reduce such undesirable components in the detector output signals. In particular, with respect to conventional thermal imaging systems, it is generally thought to be impractical to operate such systems without active stabilization of the temperature of the detectors. In some cases, thermal stabilization components may include a thermoelectric cooler (hereinafter, "TE cooler") that is thermally coupled to the detectors (e.g., the substrate on which the detectors are fabricated is mounted on the TE cooler) to hold the detectors at a predetermined temperature. Depending on the difference between the predetermined stabilization temperature and the actual ambient temperature in the vicinity of the detectors, the TE cooler may consume appreciable power resources of the imaging system.

SUMMARY OF THE INVENTION

One embodiment of the invention is directed to an imaging apparatus, comprising a plurality of pixels to detect radiation and to output image signals based on the detected radiation and a temperature sensor to detect an ambient temperature. The imaging apparatus further comprises means, coupled to the plurality of pixels and the temperature sensor, for determining a variation of a calibration parameter of a pixel during operation of the imaging apparatus after an initial calibration procedure.

Another embodiment of the invention is directed to a method of calibrating an imaging system comprising a thermal sensor. The method comprises an act of determining a variation of a calibration parameter of a pixel of the thermal sensor during operation of the imaging apparatus after an initial calibration procedure.

A further embodiment of the invention is directed to a method for generating a gain calibration parameter of a pixel. The method comprises acts of shielding the pixel from scene radiation at a first time and measuring a resistance of the pixel and an ambient temperature at the first time, shielding the pixel from scene radiation at a second time and measuring a resistance of the pixel and an ambient temperature at the second time, and calculating the gain calibration parameter using the resistance of the pixel and the ambient temperature at the first time and the resistance of the pixel and the ambient temperature at the second time.

Another embodiment of the invention is directed to an imaging apparatus, comprising a plurality of pixels to detect radiation and to output image signals based on the detected radiation, a temperature sensor to detect an ambient temperature, and a data storage device to store first and second ambient temperature values and first and second resistance values for each pixel of the plurality of pixels. The imaging apparatus further comprises means for calculating a gain calibration parameter for each pixel of the plurality of pixels using the first and second ambient temperature values and first and second resistance values for each pixel of the plurality of pixels.

A further embodiment of the invention is directed to a method comprising acts of determining a gain of the pixel between first and second times, exposing the pixel to both scene and ambient radiation at a third time, and measuring an ambient temperature of the pixel at the third time. The method further comprises calculating an offset calibration parameter of the pixel using the gain of the pixel between the first and second times and the ambient temperature of the pixel at the third time.

Another embodiment of the invention is directed to an imaging apparatus, comprising at least one pixel to detect radiation and to output image signals based on the detected radiation and a temperature sensor to detect an ambient temperature. The imaging apparatus further comprises means for calculating an offset calibration parameter for the at least one pixel using a gain of the at least one pixel between first and second times and an ambient temperature at a third time, wherein the pixel is exposed to both scene and ambient radiation at the third time.

A further embodiment of the invention is directed to a method of performing an offset and gain calibration procedure after an initial calibration procedure. The calibration procedure comprises acts of calculating a gain of a pixel between first and second times, measuring an ambient temperature of the pixel and a resistance of the pixel at a third time, wherein the pixel is exposed to both ambient and scene radiation at the third time, and determining a change in temperature of the pixel between the second and third time attributable to solely scene radiation using the gain of the pixel between the first and second times and the ambient temperature and resistance of the pixel at the third time.

DETAILED DESCRIPTION

Figure 1:
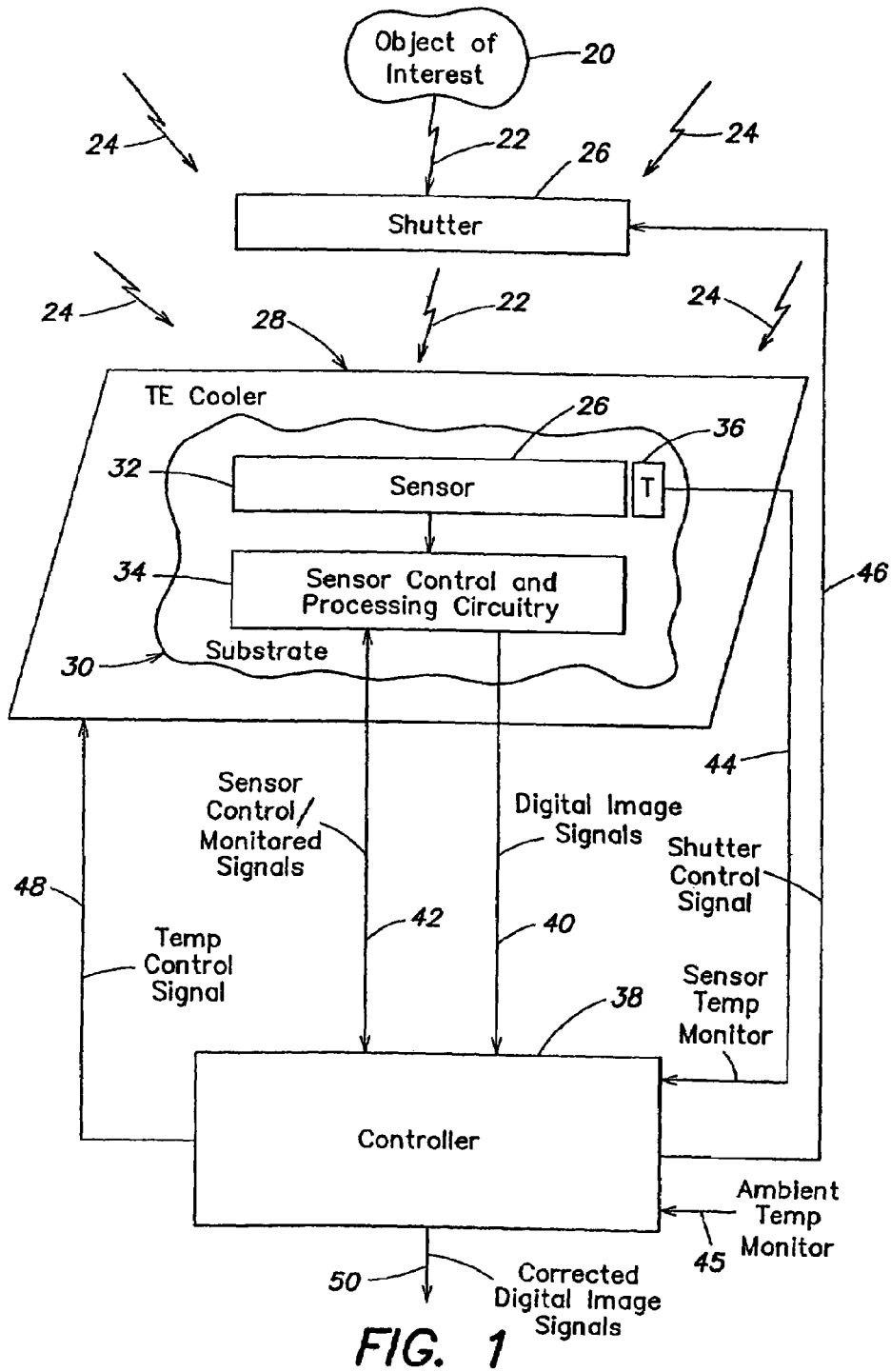
FIG. 1 is a diagram showing a portion of an imaging system according to one embodiment of the invention.

As discussed above, a radiation sensor outputs signals based on radiation that impinges on the sensor. Such a sensor may be used in an imaging system that produces images (e.g., on a display) based on radiation incident to the sensor from a scene of interest. The sensor output signals, however, may contain significant undesirable components due in part to changes in temperature of the sensor itself that are not necessarily due to the radiation of interest. In some cases, these undesirable signal components may be hundreds of times larger than the instantaneous signals resulting from the radiation of interest in the scene being imaged, thereby detrimentally reducing the dynamic range of the sensor and/or processing circuitry associated with the sensor with respect to the radiation of interest.

With respect to undesirable signal components, changes in temperature of the sensor that are not related to the radiation of interest may have an average effect over time (i.e., a DC drift in the sensor output signals). Such changes in temperature may be related to ambient temperature variations, such as a change in temperature of a substrate on which the sensor is fabricated, a change in temperature of a package in which the sensor is housed, or a change in the average temperature of the scene of interest around the sensor. Additionally, essentially instantaneous (i.e., AC) undesirable signal components may be observed due to "self-heating" of the sensor, for example, when a bias voltage initially is applied to the sensor and current begins to flow through the sensor, producing heat. Furthermore, individual detectors of a detector array constituting an imaging sensor each may respond differently to temperature variations, creating undesirable signal components due to detector non-uniformities.

In view of the foregoing, the present invention is directed generally to methods and apparatus for compensating operating parameters and/or output signals of a radiation sensor for temperature variations of the sensor that are not due to radiation of interest. The compensation provided by various embodiments of methods and apparatus of the invention significantly reduces undesirable components in the instantaneous signals output by the sensor. In one aspect of the present invention, the radiation sensor is an infrared thermal imaging sensor including an array of thermal detectors, such as bolometers. It should be appreciated, however, that the invention is not limited in this respect, as various compensation methods, apparatus, and concepts discussed herein may be applied generally to a variety of sensors and detection devices.

In one embodiment, methods and apparatus of the invention provide compensation for temperature variations of a sensor without thermally stabilizing the sensor itself; in particular, the sensor is allowed to freely vary in temperature and is dynamically compensated for temperature variations. In one aspect of this embodiment, one or more operating and/or calibration parameters associated with the sensor are dynamically determined or updated based on temperature variations of the sensor, and used to dynamically compensate for changes in operational characteristics of the sensor due to the temperature variations of the sensor. Essentially, in one aspect, the methods and apparatus of this embodiment provide continuous thermal compensation feedback without thermal stabilization of the sensor through dynamic operating and/or calibration parameter adjustments. Accordingly, methods and apparatus of the invention according to one embodiment facilitate the design of a thermal imaging system that does not require thermal stabilization components (e.g., a thermoelectric cooler), thereby providing for reduced system power consumption and potential production cost savings.

Some examples of operating parameters associated with the sensor that may be dynamically adjusted based on sensor temperature variations according to one embodiment of the invention include, but are not limited to, an average (i.e., DC) bias current of the sensor, a bias voltage of the sensor, and a waveform and amplitude of an AC signal used to compensate for sensor self-heating. Additionally, for imaging sensors including an array of detectors, examples of calibration parameters that may be dynamically adjusted based on sensor temperature variations include individual detector offset and response (gain) coefficients that account for differences in operating characteristics from detector to detector.

Following below are more detailed descriptions of various concepts related to, and embodiments of, methods and apparatus according to the present invention for compensating a radiation sensor for temperature variations of the sensor. It should be appreciated that various aspects of the invention, as discussed above and outlined further below, may be implemented in any of numerous ways, as the invention is not limited to any particular manner of implementation. Examples of specific implementations are provided for illustrative purposes only.

Imaging System Construction and Operation

FIG. 1 is a diagram showing a portion of an imaging system according to one embodiment of the invention. Some of the basic components of the imaging system shown in FIG. 1 include a shutter 26, a sensor 32, sensor control and processing circuitry 34, and a controller 38. In one aspect of the system of FIG. 1, the sensor 32 may comprise a thermal imaging sensor that responds primarily to infrared radiation, wherein the sensor includes an array of thermal detectors, such as bolometers. At least one operational characteristic of a bolometer that may be affected by temperature variations of the bolometer itself is a resistance of the bolometer, as discussed in greater detail below.

According to yet another aspect of the imaging system shown in FIG. 1, the sensor 32 and the circuitry 34 may be monolithically integrated on a semiconductor substrate 30 along with a temperature sensor 36, which outputs a sensor temperature signal 44 corresponding to the temperature of the sensor 32. FIG. 1 also shows that in one embodiment, the substrate 30 may be thermally coupled to (e.g., mounted on) a TE cooler 28 which provides thermal stabilization for the sensor 32. It should be appreciated, however, that the invention is not limited in this respect, as other embodiments of the invention discussed further below do not necessarily require, or may necessarily exclude, the TE cooler 28.

While not shown explicitly in FIG. 1, the substrate 30 including the sensor 32 and the circuitry 34, along with the TE cooler 28, may be housed together in a vacuum package having a window that allows radiation to pass through to the sensor 32. In embodiments of the invention that do not employ the TE cooler 28, the vacuum package merely may house the substrate 30 including the sensor 32 and the circuitry 34.

In the system of FIG. 1, according to one embodiment, the controller 38 monitors the sensor temperature signal 44 output by the temperature sensor 36, receives digitized signals 40 output by the circuitry 34 (which represent signals output by the sensor 32), and exchanges various other sensor control and monitor signals 42 with the circuitry 34. Additionally, according to one embodiment, the controller 38 also may monitor an ambient temperature signal 45 corresponding to an ambient temperature outside the package housing the sensor 32. In various embodiments of the invention employing the TE cooler 28, the controller 38 also may output a temperature control signal 48 to the TE cooler 28 in response to one or more of the sensor temperature signal 44, the ambient temperature signal 45, or a sensor temperature as calculated based on an average value of the digitized output signals 40. Finally, as shown in FIG. 1, the controller 38 outputs a shutter control signal 46 to control the operation of the shutter 26, as discussed further below.

With respect to various functions of the controller 38, as well as other components of imaging systems according to various embodiments of the invention, it should be appreciated that the invention is not limited to any particular manner of implementation. For example, methods and apparatus for compensating a radiation sensor for temperature variations of the sensor as discussed herein may be implemented in hardware, software, or various combinations thereof. In particular, the controller 38 may include dedicated hardware to perform various functions and/or may include one or more processors programmed using microcode or software to execute various algorithms to perform various functions discussed herein. In this respect, it should be appreciated that the controller 38 also may include a variety of digital logic circuits and memory or storage circuits or devices, including volatile, programmable, and permanent memory circuits or devices (e.g., RAM, ROM, EPROM, EEPROM). Such components are not necessarily explicitly indicated in each of the figures showing the controller 38.

As illustrated in FIG. 1, an object of interest 20 in a scene to be imaged emanates radiation 22. The radiation 22 constitutes the radiation of interest from which an image of the object of interest 20 is generated by the imaging system. FIG. 1 also illustrates background radiation 24, which may related to an average temperature of the scene to be imaged, and in some cases also may be related to the ambient temperature in the vicinity of the package housing the sensor 32. For thermal imaging systems in particular, at a given temperature of the sensor 32, this background radiation 24 may contribute to an average (i.e., DC) component of signals from the sensor 32, and hence may be compensated for (e.g., subtracted out of the signals) by the imaging system. Accordingly, it should be appreciated that the instantaneous signals of interest output by the sensor 32 typically may be considered as essentially time-varying (i.e., essentially AC components) with respect to an average DC signal component. More specifically, in thermal imaging systems, the signals of interest output by the sensor 32 correspond to the radiation 22 from one or more objects having a temperature different than that of the average scene temperature.

Figure 2:
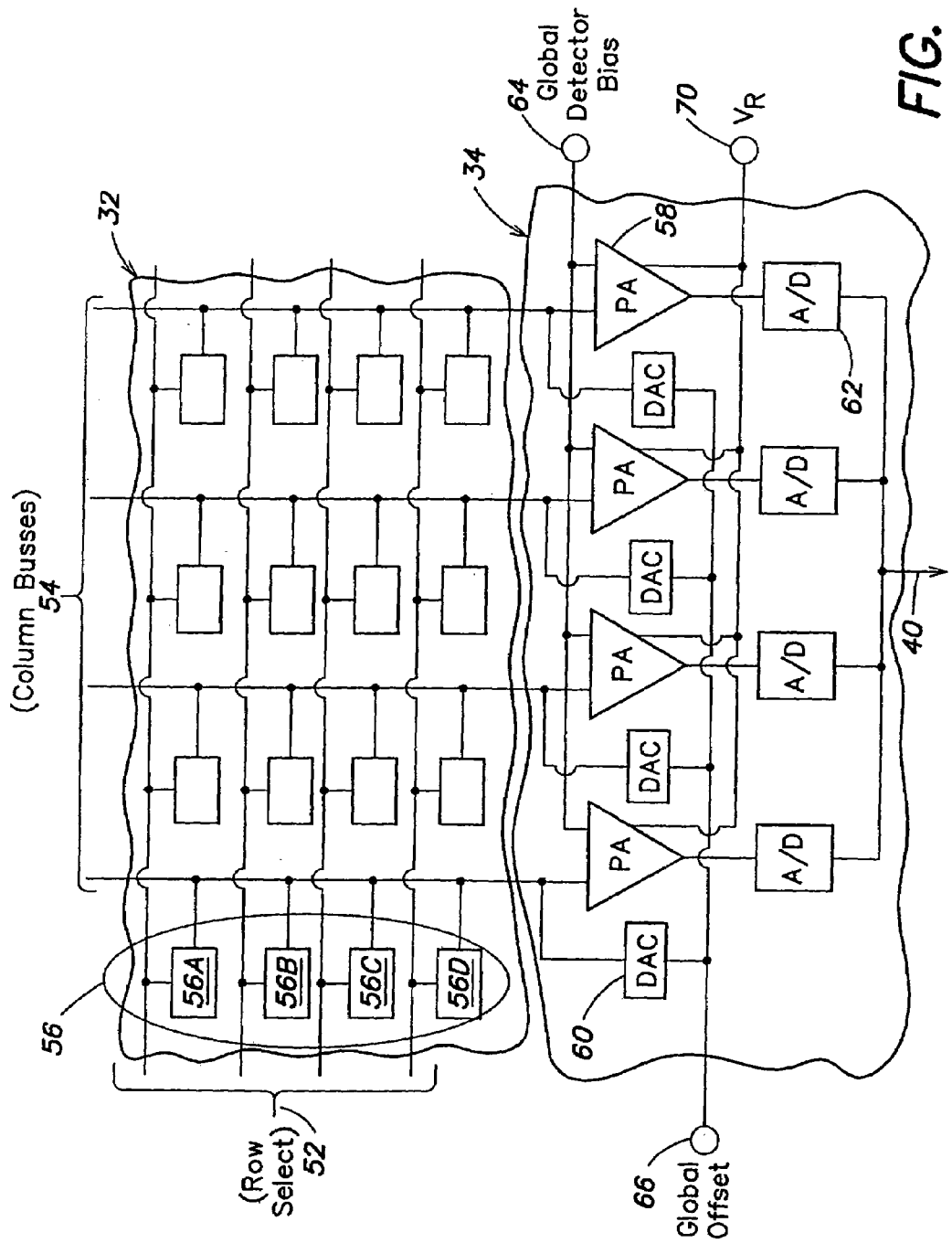
FIG. 2 is a diagram showing a portion of an integrated sensor array and some associated signal processing circuitry used in the imaging system of FIG. 1, according to one embodiment of the invention.

FIG. 2 is a diagram showing a portion of an integrated sensor including an array of detectors and some associated signal processing circuitry used in the imaging system of FIG. 1, according to one embodiment of the invention. In particular, FIG. 2 illustrates a portion of the sensor 32, showing a four-by-four array of detector unit cells arranged in rows and columns. In FIG. 2, a first column 56 of detector unit cells is particularly identified, including four detector unit cells 56A, 56B, 56C, and 56D. According to one embodiment, each row of the sensor 32 may be selected by a corresponding row select signal 52, and each column of unit cells is associated with a common column bus 54, on which each of the unit cells of the column outputs a signal.

From FIG. 2, it may be appreciated that for each row of the sensor 32 that is selected via the row select signals 52, each column bus 54 carries one signal corresponding to a respective detector unit cell of the selected row. In particular, according to one embodiment of the invention, each row of the sensor 32 is sequentially selected (e.g., the row select signals may be derived from control signals output by the controller 38 shown in FIG. 1), and the respective detector unit cells of the selected row output a signal on a corresponding column bus 54. Additionally, the column busses 54 may be "enabled" or activated with a particular timing to pass the output signals from the selected row of unit cells onto the processing circuitry 34 (e.g., again via control signals output by the controller 38). In this manner, rows of detector unit cells may be scanned in a manner similar to that of a television video signal (i.e., a raster scan). For simplicity, various row select and column bus enable circuitry is not illustrated in FIG. 2, and it should be appreciated that such circuitry may be implemented in a variety of manners.

FIG. 2 also shows a portion of the sensor control and processing circuitry 34 that is integrated with the sensor 32. In particular, FIG. 2 shows that each column bus 54 of the sensor 32 is coupled to a preamplifier/integrator 58 (labeled in FIG. 2 as "PA"). Each of the PAs 58 also receives as an input a global detector bias 62, which provides a common DC bias voltage for all of the detector unit cells of the sensor 32, as discussed further below. Additionally, FIG. 2 shows that the PAs 58 are each coupled to a common supply voltage 70 (labeled in FIG. 2 as "$V_R$"), which provides a common source of current for the PAs 58 to drive respective selected detector unit cells of the sensor 32. The instantaneous current drawn from the voltage $V_R$ by a given preamplifier/integrator 58 and supplied to a selected detector unit cell when a scene is actively being viewed preferably constitutes the instantaneous signal of interest from the selected detector, as also discussed further below.

In FIG. 2, each column bus 54 of the sensor 32 is also coupled to a digital-to-analog converter 60 (labeled in FIG. 2 as "DAC") included in the sensor control and processing circuitry 34. Each DAC 60 is in turn coupled to a common or "global" offset 66. The global offset 66 may be a voltage or current applied to all of the DACs 60 to ultimately provide a bias current to each selected detector unit cell via the column busses 54. As discussed further below in connection with FIGS. 3 and 4, each DAC 60 is controlled by the controller 38 to provide a coarse offset adjustment to the bias current supplied to each selected detector unit cell, to compensate for detector non-uniformities (i.e., non-uniform responses from detector to detector).

Additionally, FIG. 2 shows that the output of each PA 58 is coupled to an analog-to-digital converter 62 (labeled in FIG. 2 as "A/D"), which converts the analog signal output by each PA to a digital signal 40. At least one example of an analog-to-digital converter implementation for the A/Ds 62 suitable for purposes of the present invention is provided in U.S. Pat. No. 6,225,937, issued May 1, 2001, and entitled "METASTABILITY RESOLVED MONOLITHIC ANALOG-TO-DIGITAL CONVERTER," which patent is hereby incorporated herein by reference. It should be appreciated, however, that the present invention is not limited to the analog-to-digital converter implementations discussed in this patent, as other implementations are possible.

While not explicitly shown in FIG. 2 (again for purposes of simplicity), the A/Ds 62 are sequentially enabled via control signals output by the controller 38 shown in FIG. 1, so that each digital signal may be individually output from a corresponding A/D as the signal 40, and thereafter individually processed and/or stored in memory by the controller 38. Accordingly, it should be appreciated that each row of the sensor is sequentially enabled to obtain a set of "parallel" signals corresponding to the unit cells of the selected row, these signals are converted by the A/Ds 62 to a set of parallel digital signals, and then each signal from the set of digital signals is sequentially passed onto the controller 38 for individual processing and/or storage.

Figure 3:
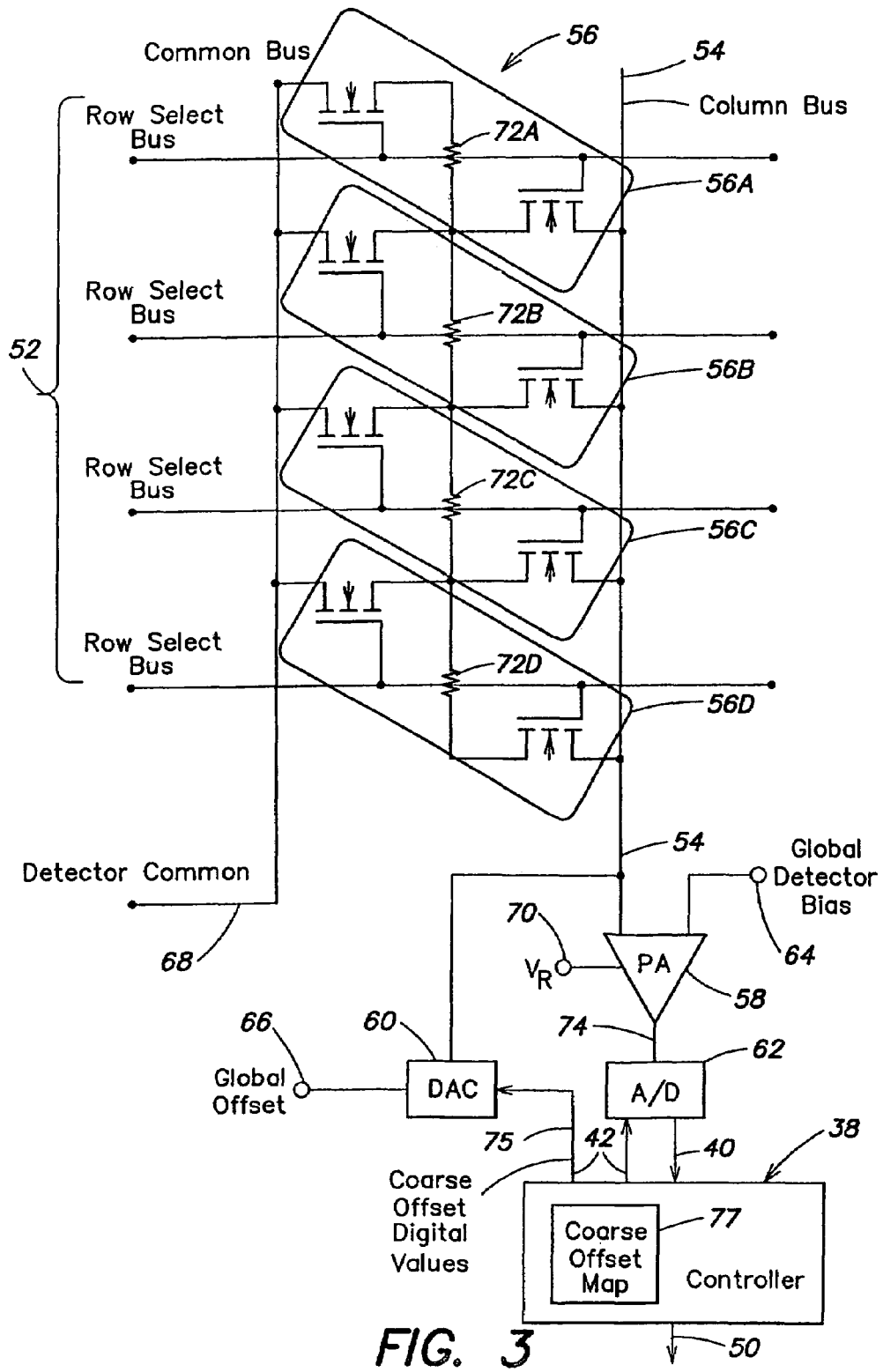
FIG. 3 is a diagram showing a more detailed view of a portion of the sensor array illustrated in FIG. 2, according to one embodiment of the invention.

FIG. 3 is a diagram showing a more detailed view of a portion of the sensor 32 illustrated in FIG. 2, according to one embodiment of the invention. In particular, FIG. 3 shows in greater detail the four unit cells 56A, 56B, 56C, and 56D of the column 56 of the sensor 32. FIG. 3 also shows the PA 58, the DAC 60 and the A/D 62 associated with the column 56. As can be seen in FIG. 3, according to one embodiment of the invention, each detector unit cell includes two transistors each having a gate coupled to the same row select bus. Each unit cell also includes a detector, illustrated symbolically as the resistors 72A, 72B, 72C, and 72D respectively in the unit cells 56A, 56B, 56C, and 56D. Upon the activation of a row select signal for a particular row, one transistor of the unit cell connects one terminal of the detector to a detector common 68 (e.g., a ground potential), and the other transistor of the unit cell connects the other terminal of the detector to the column bus 54. FIG. 3 also illustrates that the controller 38 includes a coarse offset map 77 that provides the DAC 60 for the column 56 with coarse offset digital values 75 for each of the unit cells of the column 56. The coarse offset digital values 75 control the DAC 60 to adjust the global bias current provided by the global offset 66, so as to compensate for detector non-uniformities, as discussed further below.

Figure 4:
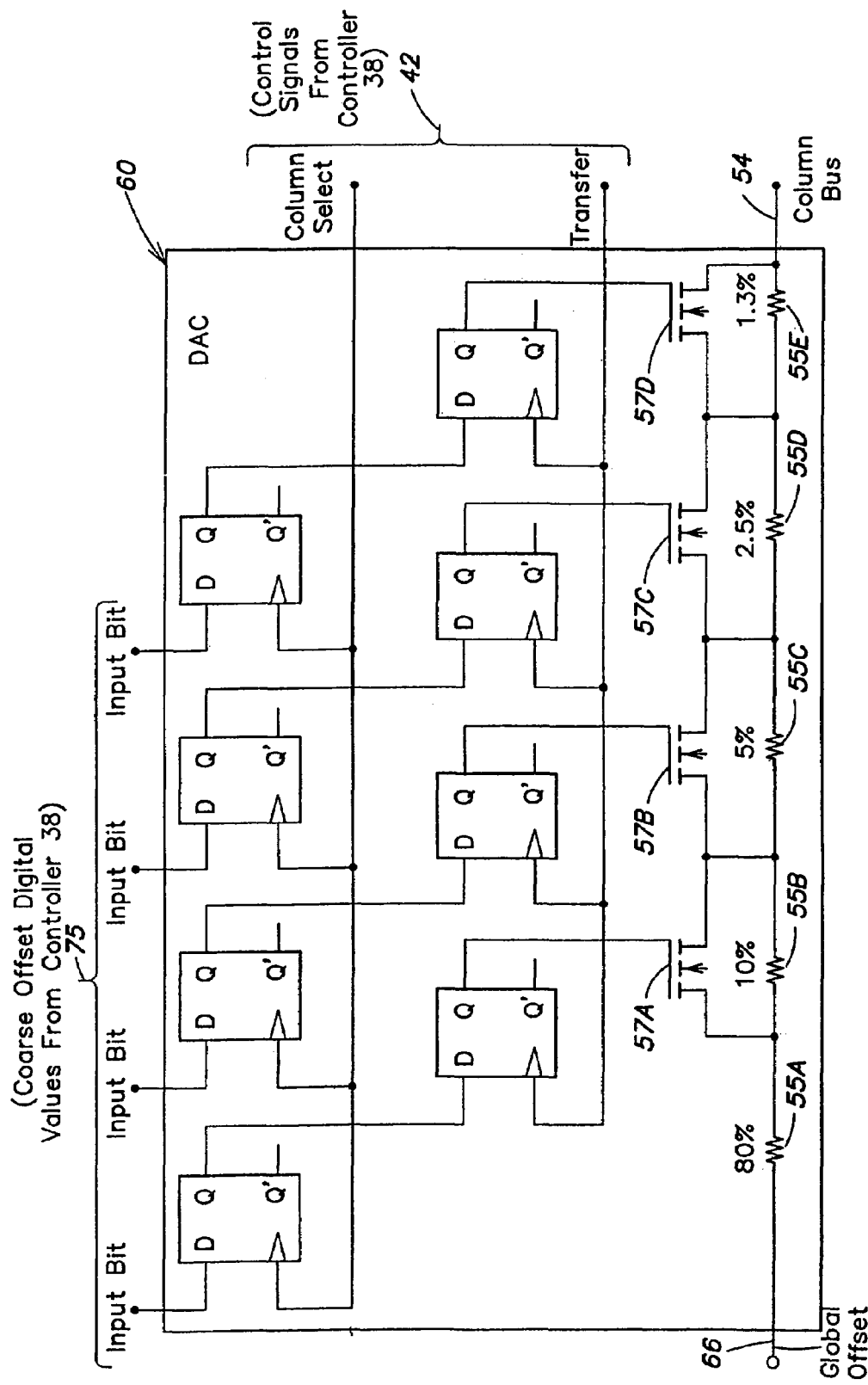
FIG. 4 is a diagram showing one example of a digital-to-analog converter used in the processing circuitry shown in FIGS. 2 and 3, according to one embodiment of the invention.

FIG. 4 is a diagram showing one example of the DACs 60 used in the sensor processing circuitry 34 shown in FIGS. 2 and 3, according to one embodiment of the invention. Other examples of digital-to-analog converter implementations for the DACs 60 suitable for purposes of the present invention are provided in U.S. Pat. No. 6,274,869, issued Aug. 14, 2001, and entitled "DIGITAL OFFSET CORRECTOR," which patent is hereby incorporated herein by reference. It should be appreciated, however, that the present invention is not limited to the examples of DACs discussed in this application, nor to the exemplary DAC illustrated in FIG. 4, as other implementations are possible.

Essentially, the DAC 60 shown in FIG. 4 is used to incrementally adjust the value of a bias resistor coupled between a column bus 54 and the global offset 66, so as to adjust a DC bias current provided to each of the detectors of the sensor 32. In FIG. 4, this bias resistor is shown schematically in five parts for purposes of illustration, as the resistors 55A, 55B, 55C, 55D, and 55E. Different parts of the bias resistor are selectively "bypassed" to change the overall bias resistance by activating one or more of bypass transistors 57A, 57B, 57C, and 57D via a corresponding one of the input bits of the coarse offset digital values 75. For each detector of the sensor 32, the controller 38 stores a coarse offset digital value in a coarse offset map 77 (e.g., shown in FIG. 3). This offset value corresponds to an adjustment to the bias resistance that is required for the particular detector so as to compensate for inherent non-uniformities amongst the detectors, as discussed further below.

Figure 5:
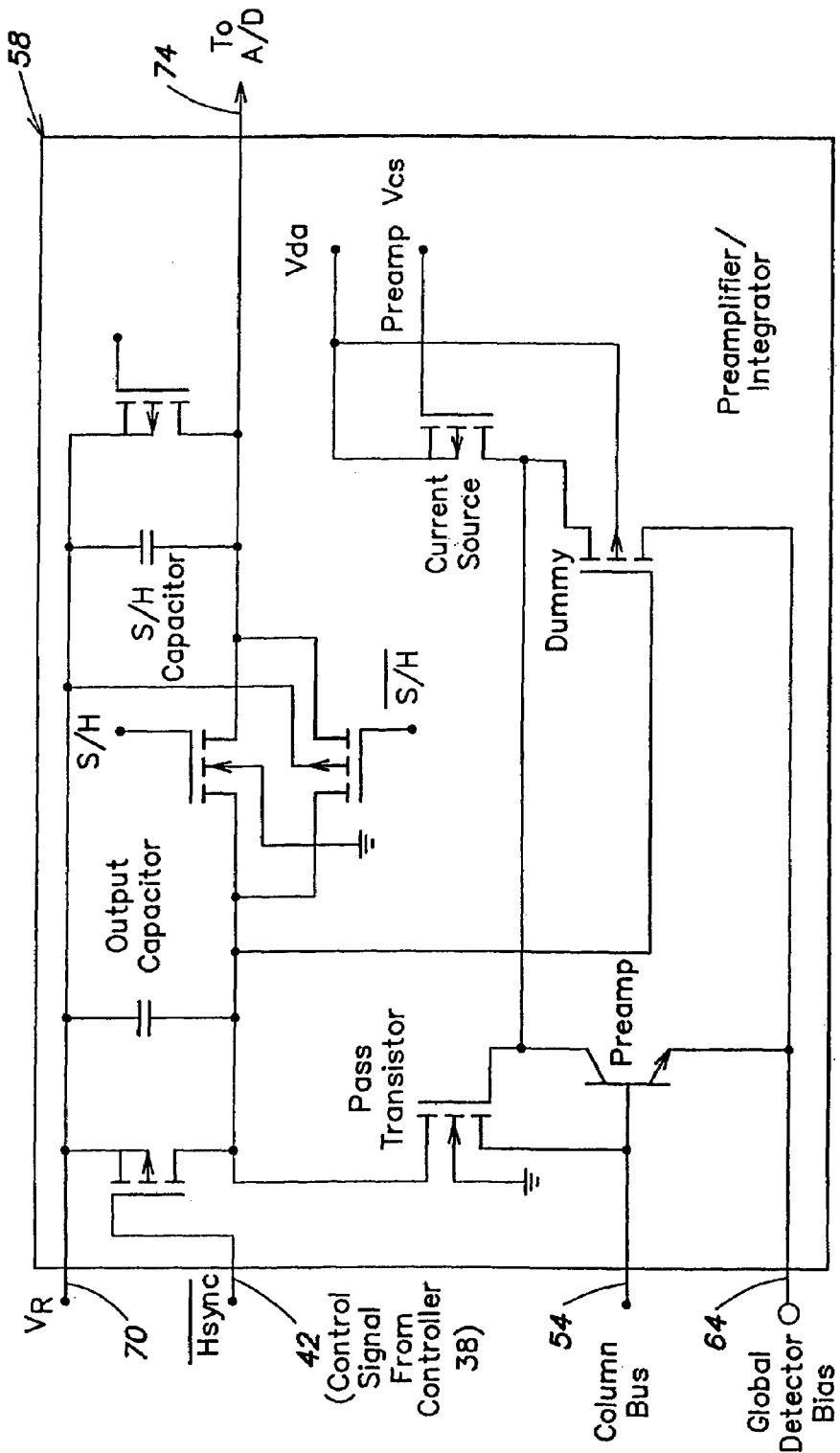
FIG. 5 is a diagram showing one example of a preamplifier/integrator used in the processing circuitry shown in FIGS. 2 and 3, according to one embodiment of the invention.

FIG. 5 is a diagram showing one example of the PAs 58 used in the processing circuitry 34 shown in FIGS. 2 and 3, according to one embodiment of the invention. Other examples of preamplifier/integrator implementations for the PAs 58 suitable for purposes of the present invention are provided in U.S. Pat. No. 6,249,002, issued Jun. 19, 2001, and entitled "BOLOMETRIC FOCAL PLANE ARRAY,"

and U.S. patent application Ser. No. 09/051,180, filed Apr. 3, 1998, and entitled "UNCOOLED FOCAL PLANE ARRAY SENSOR," which are hereby incorporated herein by reference. It should be appreciated, however, that the present invention is not limited to the examples of PAs discussed in these applications, nor to the exemplary PA illustrated in FIG. 5, as other implementations are possible.

According to one embodiment, as can be seen from the exemplary circuit of FIG. 5, the column bus 54 is actually biased at one $V_{be}$ (i.e., approximately 0.7 Volts) above the global detector bias 64, due to the base-emitter junction of the preamp transistor. FIG. 5 also illustrates that the supply voltage 70 ($V_R$) supplies current to the column bus 54 via the pass transistor, and the output capacitor is charged to a voltage representing this current, which voltage is ultimately provided as the signal 74 to the A/D 62.

With reference again to FIGS. 2 and 3, according to one embodiment of the invention, the individual detectors of the sensor 32 may be thermal detectors that detect primarily infrared radiation. Generally, a thermal detector detects radiation based upon a change in the temperature of an active region of the detector due to absorption of radiation of interest incident to the detector. Some examples of thermal detectors include, but are not limited to, pyroelectric devices, thermocouples, diode-based devices, and resistive devices, such as bolometers.

In particular, according to one embodiment of the invention, the detectors of the unit cells of the sensor 32 (e.g., the detectors 72A, 72B, 72C, and 72C of the unit cells 56A, 56B, 56C, and 56D shown in FIG. 3) may be bolometers, wherein each bolometer includes an infrared energy receiving surface that is made of a material having a resistivity that changes as its temperature changes, in response to the infrared energy impinging on and being absorbed by the material. Thus, as the bolometer absorbs radiation, both its temperature and electrical resistance change.

A measure of radiation absorbed by a bolometer can be made by measuring changes in its electrical resistance. For example, by placing the bolometer in series with a voltage supply (i.e., D.C. coupling the bolometer), the current in the bolometer varies in accordance with the amount of infrared energy incident to the bolometer. Accordingly, as shown in FIG. 3, a preamplifier/integrator (PA) 58 is connected to a voltage supply 70 ($V_R$) to provide current to a particular selected bolometer, and is serially connected to the bolometer so as to produce an output signal 74 representative of the incident infrared energy. As discussed above, the sensor 32 including an array of such bolometers produces a plurality of output signals that are ultimately fed to the controller 38, which processes the signals to provide an electronic image of the source of the infrared energy.

One significant issue related to bolometers is that various operational characteristics of bolometers (in addition to the sensitivity of its active area to incident radiation and corresponding changes in bolometer resistance due to the incident radiation of interest) are functions of the temperature of the bolometer itself. As a result, in some cases it may be challenging to separate signals of interest due to incident radiation from undesirable signal components due to temperature variations of the bolometer itself.

Preliminarily, it should be appreciated that gradual or steady state changes in temperature of the bolometer itself (e.g., due to changes in temperature in the vicinity of the bolometer) alter the steady state resistance of the bolometer; hence, one operational characteristic of the bolometer that changes as a function of bolometer temperature variations is its resistance. Such changes in steady state resistance due to bolometer temperature variations may be significantly larger (e.g., up to hundreds of times larger) than instantaneous changes in bolometer resistance due to incident radiation of interest. As a result, the effect of bolometer steady state temperature variations may significantly degrade the dynamic range and signal-to-noise ratio of bolometer output signals with respect to the radiation of interest.

Accordingly, as discussed above, imaging systems employing thermal sensors including bolometers typically require some type of thermal stabilization mechanism, as illustrated for example by the TE cooler 28 shown in FIG. 1. Such thermal stabilization mechanisms generally are employed to maintain the sensor at a predetermined temperature in an effort to minimize any changes in steady state resistance due to steady state changes in bolometer temperature. With reference again for the moment to FIG. 3, once the bolometer array sensor is thermally stabilized, the bolometers may be appropriately biased such that average output signals from the bolometers, once amplified by the PA 58, fall approximately in the middle of the available range of the A/D 62. This type of biasing generally affords the maximum dynamic range for bolometer output signals corresponding to radiation of interest within the performance limitations of the PA 58 and the A/D 62.

However, as discussed further below, as an alternative to thermal stabilization (or in addition to some degree of thermal stabilization) of bolometer array sensors, various operating and/or calibration parameters of the bolometers may be varied to compensate for steady state resistance changes resulting from temperature variations of the bolometer. Accordingly, one embodiment of the present invention is directed to methods and apparatus for compensating operating parameters and/or output signals of a radiation sensor including an array of bolometers for temperature variations of the bolometers that are not due to radiation of interest, without employing thermal stabilization techniques for the sensor (e.g., without using a TE cooler). In one aspect, the methods and apparatus of this embodiment allow the temperature of the sensor to freely vary, and provide continuous thermal compensation feedback through dynamic adjustments to various operating and calibration parameters associated with the sensor. For purposes of this disclosure, "operating parameters" associated with a sensor generally refer to signals applied to the sensor during normal operation of the sensor to bias the sensor, while "calibration parameters" associated with a sensor generally refer to various parameters that may be used for processing output signals from the sensor to adjust for non-uniformities amongst individual radiation detectors of the sensor. Of course, it should be appreciated that the various compensation concepts discussed herein relating to sensors including bolometers may be applied more generally to sensors employing other types of radiation detectors as well.

More specifically, Applicants have appreciated that by varying one or both of the bolometer DC bias current and DC bias voltage in response to bolometer temperature variations so as to compensate for changes in steady state resistance, a suitable dynamic range and signal-to-noise ratio of bolometer output signals may be maintained. Additionally, Applicants have appreciated that by varying both of the bolometer bias current and bias voltage in a complementary manner, an essentially constant bias power may be maintained. By maintaining an essentially constant bias power, changes in the bolometer bias voltage or current themselves do not significantly contribute to or exacerbate changes in the bolometer temperature.

In addition to changes in steady state resistance due to steady state or gradual changes in bolometer temperature, a bolometer "self-heating" effect may cause bolometer temperature to change locally on a relatively instantaneous time scale, irrespective of whether or not thermal stabilization techniques are employed to stabilize the steady state temperature of the sensor. This self-heating effect also may contribute to undesirable components in output signals from the bolometer. In particular, when a bias voltage or current initially is applied to the bolometer (e.g., when a particular row is selected and the column busses are enabled in FIG. 2), current begins to flow through the bolometer, producing heat. This local heat produced by the bolometer itself in turn changes the resistance of the bolometer, independently of the radiation of interest incident to the bolometer.

In one aspect of the bolometer self-heating effect, the initial flow of current through one bolometer as the bolometer is enabled, followed by the bolometer being disabled and another bolometer being enabled (e.g., according to the scanning process discussed above in connection with FIG. 2), may be approximated by a saw tooth waveform. Accordingly, the bolometer self-heating effect may be thought of as contributing an undesirable time-varying (i.e., AC) waveform component to the bolometer output signals. The magnitude (amplitude) of this undesirable waveform component also may be a function of the steady state bolometer temperature. Applying a time-varying waveform that is essentially the inverse of the undesirable "self-heating" waveform to one of the bolometer bias current or bias voltage may significantly reduce the self-heating effect. According to one embodiment of the invention, the amplitude of such a time-varying compensation waveform is dynamically adjusted as an operating parameter based on variations in the steady state temperature of the bolometer array.

Other examples of operational characteristics of a sensor including an array of bolometers that may change as a function of temperature variations of the sensor relate to non-uniformities amongst the bolometers. For example, the nominal resistance of one bolometer compared to another at a given array temperature may be different (assuming both bolometers receive the same incident radiation, or view a "control" or "reference source"). Given an array of such bolometers, each bolometer may have a different nominal resistance at a given array temperature and viewing a given reference source. This variation in nominal resistance from bolometer to bolometer, with reference to an average nominal resistance of all of the bolometers, is referred to for purposes of this disclosure as an "offset error." Accordingly, each bolometer may be associated with a particular resistance value that reflects that bolometer's offset error. It should be appreciated, however, that this resistance value may be converted to any convenient unit of measure. For example, since the A/D 62 shown in the figures outputs digital voltage values, for purposes of the following discussion the offset error of each bolometer may be treated as a differential voltage $V_{off}$ corresponding to the offset resistance value. A set of offset error values (e.g., voltages $V_{off}$) for an array of bolometers that are used as calibration parameters to adjust output signals of an array relative to each other is referred to herein as an "offset map."

Viewing the same reference source, the offset error of each bolometer in an array may change as the temperature of the array varies. Additionally, the change in offset error due to a change in array temperature may be different from bolometer to bolometer. Accordingly, one operational characteristic of a sensor including a bolometer array that may change as a function of temperature is referred to herein as "offset error variation." Again, an offset error variation for each bolometer may be thought of as a change in the offset resistance value of the bolometer due to a change in array temperature. It should be appreciated that the offset error variation of the bolometers is not necessarily a linear function of sensor temperature over a wide range of temperatures.

Yet another operating characteristic of a sensor including a bolometer array that may change as a function of temperature relates to a response or "gain" of each bolometer in the array. For example, the response to radiation of interest of one bolometer compared to another bolometer at a given array temperature (referred to hereafter as a "calibration temperature") may be different. This variation in response from bolometer to bolometer at a given calibration temperature is referred to for purposes of this disclosure as "gain error." Since a bolometer essentially measures the temperature of an object of interest relative to an average temperature of the scene being imaged, the gain of a bolometer may be expressed as $(\Delta V_{bol}/\Delta T_{obj})_{Tcal}$, where $V_{bol}$ indicates the output digital voltage from an A/D 62 representing a signal of interest from a selected bolometer, $T_{obj}$ indicates the temperature of the object of interest in the scene that emits radiation incident to the bolometer, and $T_{cal}$ indicates the calibration temperature at which the bolometer array is held to measure the gain. Accordingly, each bolometer may be associated with a particular gain value, and a set of gain values for a sensor including an array of bolometers at a particular calibration temperature is referred to herein as a "gain map." The gain values of the gain map are used as calibration parameters, in a manner similar to that of the offset error values of the offset map discussed above, to adjust output signals of an array relative to each other.

Similar to offset errors, the gain or response of each bolometer in an array may change as the temperature of the array varies (e.g., from the calibration temperature). Additionally, the change in bolometer gain due to a change in array temperature may be different from bolometer to bolometer. Accordingly, another operational characteristic of a bolometer array that may change as a function of temperature is referred to herein as "gain variation." Again, gain variation for each bolometer may be thought of as a change in the gain value of the bolometer due to a change in array temperature, and may be expressed for purposes of the following discussion as a "gain variation function."

As with the TCR discussed above, it should be appreciated that the gain variation function of the bolometers is not necessarily a linear function of sensor temperature over a wide temperature range; hence, according to various embodiments, a nonlinear function, or suitable linear or piece-wise linear approximations for the gain variation function over a particular range of temperatures, may be derived and employed to compensate for gain variation. For example, according to one embodiment, a single gain adjustment factor that multiplies the gain value of a bolometer based on a difference between a measured sensor temperature and the calibration temperature at which the gain values for the array were originally obtained is derived for each bolometer over an anticipated operating temperature range (i.e., a linear dependence of gain variation on temperature is assumed over this temperature range). A set of such gain adjustment factors for the bolometer array (i.e., a "gain adjust map") subsequently is used to dynamically adjust the gain values (gain calibration parameters) stored in the gain map. In other embodiments, nonlinear gain variation functions, or interpolation of piece-wise linear approximations for gain variation functions, may be similarly used to dynamically adjust the gain calibration parameters stored in the gain map.

In sum, a number of operating and calibration parameters associated with a sensor including a bolometer array may be dynamically adjusted as a function of sensor temperature, so as to compensate for changes in operational characteristics of the individual bolometers of the sensor due to temperature variations of the sensor. As outlined immediately above, these parameters may include, but are not necessarily limited to, a DC bias voltage, a DC bias current, and an AC self-heating compensation waveform applied to the bolometers (operating parameters), as well as individual entries of an offset map and a gain map that correct for non-uniformities amongst the bolometers (calibration parameters).

According to various embodiments of the invention, the operating parameters discussed above (i.e., DC bias voltage, DC bias current, and AC self-heating compensation waveform) are "globally" applied to all of the individual bolometers of the sensor, and one or more of these operating parameters may be dynamically adjusted in response to temperature variations of the sensor via analog or digital feedback loop implementations. Additionally, according to various embodiments of the invention, the calibration parameters of one or both of the offset and gain maps discussed above, either alone or in combination with one or more of the operating parameters, may be dynamically adjusted based on temperature variations of the sensor on a bolometer by bolometer basis. In some cases, dynamic adjustment may be performed using nonlinear offset and gain variation functions, interpolations of piece-wise linear approximations of offset and gain variation, or linear approximations of offset and gain variation. The foregoing concepts are discussed in turn in greater detail below, in connection with FIGS. 6–10.

Figure 6:
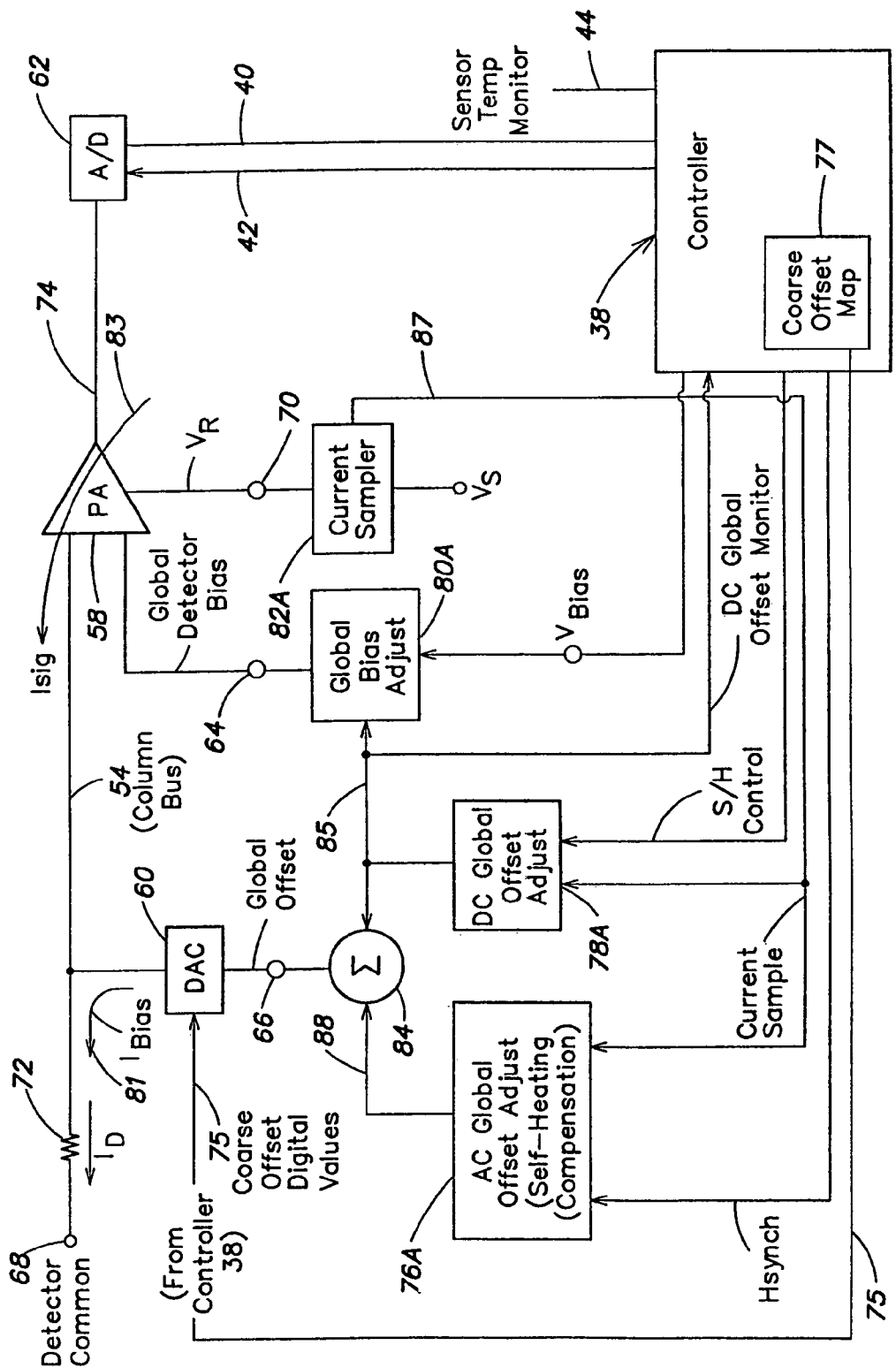
FIG. 6 is a diagram showing a more detailed view of the portion of the imaging system shown in FIG. 3, illustrating one possible implementation of various temperature compensation features, according to one embodiment of the invention.

FIG. 6 is a diagram showing a more detailed view of the portion of the imaging system shown in FIG. 3, illustrating one possible implementation of various temperature compensation features, according to one embodiment of the invention. In particular, FIG. 6 demonstrates some basic elements of one example of a primarily analog circuit implementation for dynamic control of various operating parameters associated with a sensor. Of course, it should be appreciated that the invention is not limited to the implementation outlined in FIG. 6, as other implementations are possible, as discussed further below.

In FIG. 6, a generic selected or enabled detector of the sensor 32 (e.g., see FIGS. 2 and 3) is shown for purposes of illustration as the resistor 72 coupled to the detector common 68. As discussed above in connection with FIGS. 2 and 3, each enabled detector of a selected row is coupled to a corresponding DAC 60 and PA 58 via the column bus 54. Accordingly, FIG. 6 shows the DAC 60 and the PA 58 coupled to the generic detector 72 via the column bus 54. Also as in FIGS. 2 and 3, FIG. 6 shows that the DAC 60 receives a global offset 66, and the PA 58 receives a global detector bias 64 and a reference supply voltage $V_R$ 70. FIG. 6 also illustrates the A/D 62 and the controller 38, which process digital signals representing signals output by the detector 72 on the column bus 54.

As discussed above in connection with FIGS. 2 and 3, according to one embodiment of the invention, the global offset 66, the global detector bias 64, and the voltage $V_R$ 70 are applied similarly to each DAC 60 and each PA 58 associated with the sensor, such that these signals essentially are "common" to all detectors of the array. Hence, although FIG. 6 shows only one DAC and one PA, it should be appreciated that the global offset 66, the global detector bias 64, the voltage $V_R$ 70 may be simultaneously applied to multiple DACs and PAs associated with the sensor.

As illustrated in FIG. 6, the global offset 66, via the DAC 60, determines a bias current $I_{BIAS}$ 81 through the detector 72, while the supply voltage $V_R$ 70 provides a power source to the PA 58 to allow a signal current $I_{sig}$ 83 to flow through the detector 72 in response to radiation of interest incident to the detector. The total current through the detector 72 is indicated in FIG. 6 as $I_D$. The global detector bias 64 provides a bias voltage for the detector 72 via the PA 58; essentially, as discussed above in connection with FIG. 5, the PA 58 maintains the column bus 54 at a potential approximately 0.7 Volts above the global detector bias 64.

In general, as discussed above, the bias current and the bias voltage for the detector 72 are selected such that average output signals from the detector, once amplified by the PA 58, fall approximately in the middle of the available range of the A/D 62. This type of biasing generally affords the maximum dynamic range for detector output signals corresponding to radiation of interest within the performance limitations of the PA 58 and the A/D 62. In some cases, the bias current $I_{BIAS}$ 81 required to accomplish this may be significantly greater than the typical signal current $I_{sig}$ 83 expected from the detector. For example, in some cases it may result that $I_{BIAS}$ constitutes as much as approximately 99% of the current $I_D$ through the detector, while $I_{sig}$ constitutes merely approximately 1% of the current $I_D$. It should be appreciated, however, that these exemplary values are provided for purposes of illustration only, and that the invention is not limited in this respect.

FIG. 6 also shows various circuitry coupled to the global offset 66, the global detector bias 64, and the supply voltage 70 that is used in a feedback loop configuration to dynamically adjust one or both of the global offset 66 (and hence the detector bias current $I_{BIAS}$ 81) and the global detector bias 64 based on temperature variations of the detector 72. In particular, FIG. 6 shows a current sampler 82A which measures the current being drawn by the PA 58 from the supply voltage $V_R$ 70 to provide the signal current $I_{sig}$ 83 to the detectors of the sensor. As shown in FIG. 6, the current sampler 82A is inserted between a voltage source $V_S$ and a supply voltage terminal of the PA that receives the supply voltage $V_R$ 70. Essentially, the current sampler 82A provides a measure of an instantaneous signal current being drawn by enabled detectors of the sensor; recall that, according to one embodiment, the supply voltage $V_R$ 70 is applied to all of the PAs 58 (e.g., the supply voltage terminals to each of the PAs are tied together), and each PA in turn provides signal current to a corresponding enabled detector of a selected row. Thus, at any given time, the current sampler in this embodiment provides an indication of the total instantaneous signal current being drawn by a selected row of detectors.

Averaged over time, the current measured by the current sampler 82A shown in FIG. 6 may provide an indication of temperature variations of the detector 72 not due to the radiation of interest. In particular, as discussed above in connection with bolometers, changes in bolometer temperature affect the resistance of the bolometer, which in turn affects the signal current 83 being drawn by the bolometer. Hence, according to one embodiment, an output 87 of the current sampler 82A may be used as an input (or "error signal") to a feedback control loop as an indication of temperature variations of the detector 72.

As illustrated in FIG. 6, the output 87 of the current sampler 82A is coupled to a DC global offset adjust controller 78A and an AC global offset adjust controller 76A. According to one embodiment, the DC global offset adjust controller 78A dynamically varies a DC component of the global offset 66 (and hence a DC component of the detector bias current $I_{BIAS}$ 81) in response to temperature variations of the detector 72, as reflected in the output 87 of the current sampler 82A. Similarly, according to one embodiment, the AC global offset adjust controller 76A dynamically varies an AC component of the global offset 66 (and hence an AC component of the detector bias current $I_{BIAS}$ 81) in response to instantaneous temperature variations of the detector 72 that are not related to radiation of interest incident on the detector, as reflected in the output 87 of the current sampler 82A.

In particular, according to one embodiment, the AC global offset adjust controller 76A of FIG. 6 provides a dynamically adjusted time-varying waveform that compensates for self-heating effects of the detector 72. More specifically, as discussed above and in greater detail below in connection with FIG. 8, as a bias is initially applied to an enabled detector, the output 87 of the current sampler 82A indicates an instantaneous current component related to the initial flow of current through the detector, which begins to produce local heat. In response, the AC global offset adjust controller 76A provides an AC component to the detector bias current $I_{BIAS}$ 81 (e.g., a saw tooth or other time-varying waveform) to compensate for this effect. As illustrated in FIG. 6, according to one embodiment, an output 83 of the AC global offset adjust controller 76A is summed with an output 85 of the DC global offset adjust controller 78A at a summing node 84 to provide the global offset 66.

FIG. 6 also shows that the output 85 of the DC global offset adjust controller 78A is coupled to a global bias adjust controller 80A. According to one embodiment, the global bias adjust controller 80A dynamically adjusts the global detector bias 64 (i.e., the DC bias voltage applied to the detector 72) based on changes in the DC component of the detector bias current $I_{BIAS}$ 81, as provided by the DC global offset adjust controller 78A. In this manner, the DC global offset adjust controller 78A and the global bias adjust controller 80A maintain an essentially constant bias power for the detector 72.

In the embodiment of FIG. 6, the controller 38 may provide various signals to the global bias adjust controller 80A, the DC global offset adjust controller 78A, and the AC global offset adjust controller 76A to facilitate operation of these devices. For example, the controller 38 may provide an HSYNCH signal to the AC global offset adjust controller 76A, so as to control timing of the AC compensation waveform with respect to selection of consecutive rows of detectors in the sensor (e.g., similar to raster scanning, as discussed above). Likewise, the controller 38 also may provide a sample/hold (S/H) control signal to the DC global offset adjust controller 78A, so as to temporarily disable active feedback control of the global offset 66 for various calibration purposes, as discussed further below.

Additionally, the controller 38 may provide a bias voltage $V_{BIAS}$ to the global bias adjust controller 80A, which is adjusted by the global bias adjust controller 80A as discussed above to provide the global detector bias 64. For example, in one embodiment, the controller may include (or be associated with) a digital-to-analog converter (not shown in FIG. 6), which receives a digital signal from the controller 38 corresponding to a desired bias voltage, and outputs an analog value for the voltage $V_{BIAS}$.

In the embodiment of FIG. 6, the controller 38 also may monitor the output 85 of the DC global offset adjust controller 78A, which as discussed above is related to the DC component of the detector bias current $I_{BIAS}$ 81. According to one aspect of this embodiment, the controller 38 may use the output 85 as an indication of the temperature of the sensor 32, by calibrating the output 85 based on measurements of sensor temperature. Alternatively, as discussed above in connection with FIG. 1, the controller 38 may directly monitor sensor temperature by receiving as an input a sensor temperature signal 44 output by a temperature sensor located in proximity of the sensor 32. In some radiometry applications in which measurements of absolute temperature of objects of interest in a scene are desired, the measurement of sensor temperature provided by either the output 85 of the DC global offset adjust controller 78A or the sensor temperature signal 44 may be used in radiometric calculations to provide the required level of accuracy for radiometry measurements. It should be appreciated that one or both of the output 85 and the sensor temperature signal 44 may be input to the controller 38 as analog signals and converted, for example, by an analog-to-digital converter in the controller 38 (not shown in FIG. 6) to provide digital representations of these signals.

Finally, FIG. 6 shows that the controller 38 contains a coarse offset map 77 which includes coarse offset digital values 75 that are used to control the DAC 60, so to provide adjustments to the detector bias current $I_{BIAS}$ 81 on a detector-by-detector basis, as discussed briefly above in connection with FIG. 3. These adjustments relate to non-uniformities amongst the detectors of the sensor, and are discussed in greater detail below in connection with FIG. 10.

Figure 7:
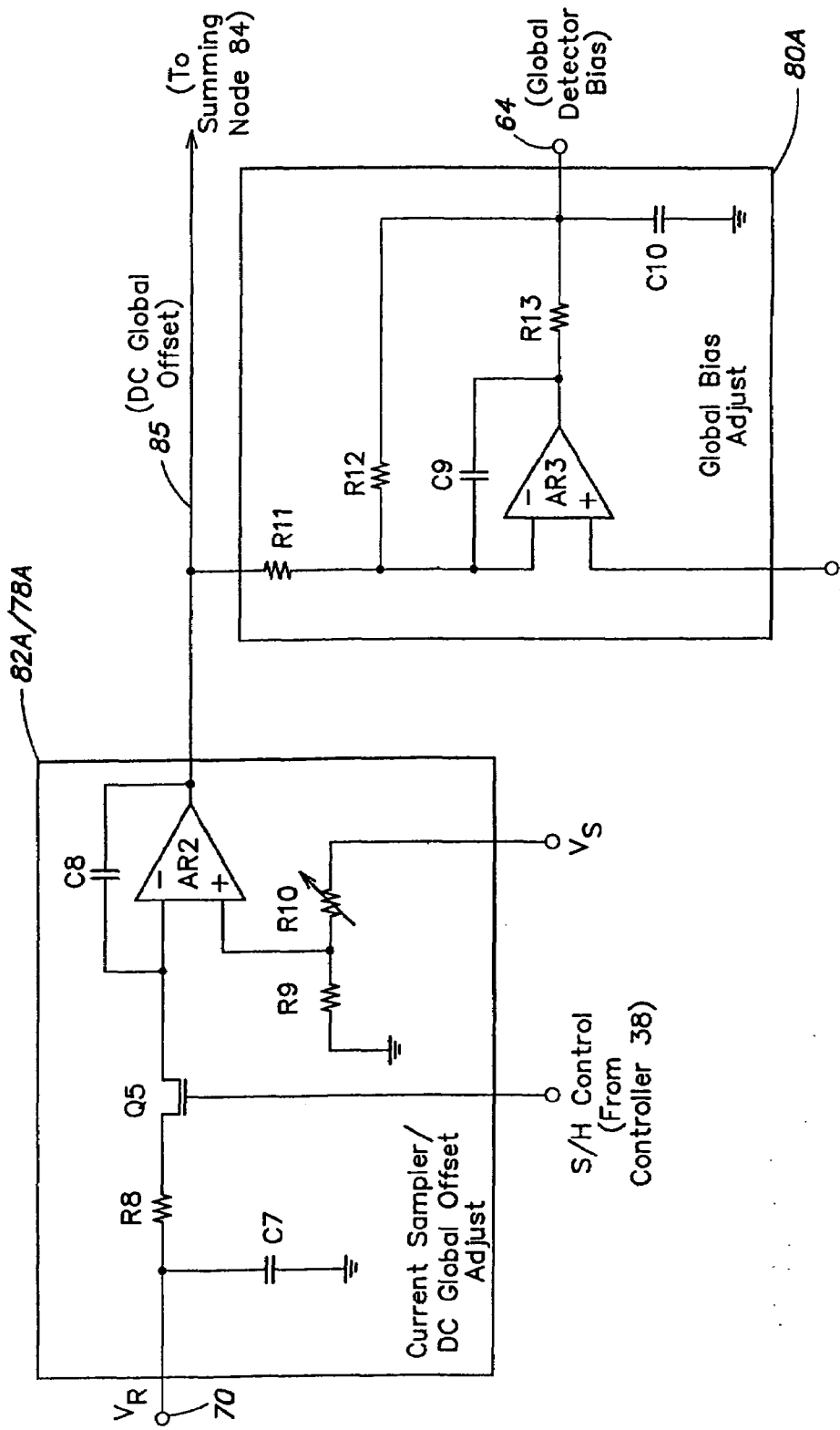
FIG. 7 is a diagram showing examples of a current sampler/DC global offset adjust circuit and a global bias adjust circuit as analog circuit implementations of the temperature compensation features shown in FIG. 6, according to one embodiment of the invention.

FIG. 7 is a diagram showing examples of analog circuit implementations for the current sampler, DC global offset adjust controller, and global bias adjust controller of FIG. 6, according to one embodiment of the invention. It should be appreciated that these examples are provided for purposes of illustration only, and that the invention is not limited to the particular circuits shown in FIG. 7. In FIG. 7, the current sampler 82A and the DC global offset adjust controller 78A are implemented in a circuit that performs both functions. In particular, resistors R9 and R10 form an adjustable voltage divider, which places a portion of the source voltage $V_S$ on the non-inverting input of amplifier AR2. Accordingly, this voltage also appears on the inverting input of AR2. Resistor R8 hence essentially provides the current sampling function; as the average current drawn from the supply voltage $V_R$ 70 changes due to temperature variations of the sensor, the current flowing through the resistor R8 changes. The amplifier AR2 in turn varies the output current 85 provided to the summing node 84 shown in FIG. 6 based on the changes in current through R8. Transistor Q5 is controlled by the S/H control signal from the controller 38; when the transistor Q5 is "disabled," the resistor R8 is disconnected from the amplifier AR2, and the capacitor C8 serves as a hold capacitor. When the transistor Q5 is "enabled", resistor R8 and capacitor C8 determine the response time of the DC global offset adjust feedback loop; according to one embodiment, values for these components are selected such that the response time of the loop is several image frames (e.g., several scans of the sensor) so as to reduce image artifacts. Capacitor C7 provides a low impedance to AC signal components in the average current drawn from the supply voltage $V_R$ 70, so that these components do not significantly affect the DC global offset adjust feedback loop.

In FIG. 7, the global bias adjust controller 80A is implemented by a circuit including amplifier AR3, which samples the DC current output 85. The resistors R11, R12, and R13 and the capacitors C9 and C10 provide gain and filtering of the sampled signal. In the exemplary circuit shown in FIG. 7, increases in the output current 85 (corresponding to increases in the detector bias current $I_{BIAS}$) cause some proportional decrease in the global detector bias 64. Hence, the circuits shown in FIG. 7 tend to act so as to keep a sum of the detector bias current and bias voltage constant, rather than keeping the product of the bias current and voltage constant (so as to maintain essentially constant detector power). However, over a relatively limited or small range of detector powers, regulating the sum rather than the product of detector bias current and voltage provides adequate control of detector power according to this embodiment.

Figure 8:
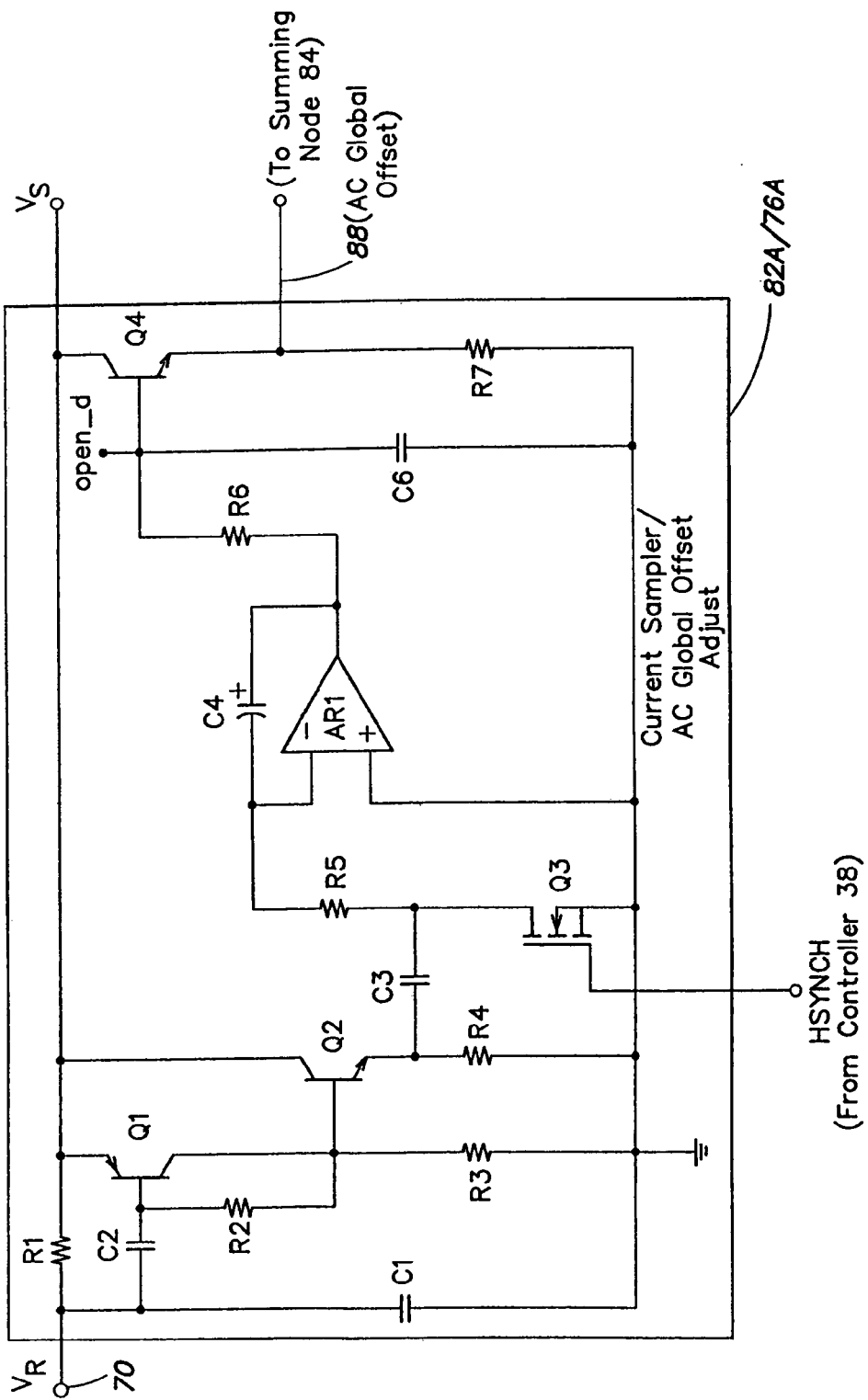
FIG. 8 is a diagram showing an example of a current sampler/AC global offset adjust circuit as an analog circuit implementation of a sensor self-heating temperature compensation feature shown in FIG. 6, according to one embodiment of the invention.

FIG. 8 is a diagram showing an example of an analog circuit implementation for the current sampler and AC global offset adjust controller of FIG. 6, according to one embodiment of the invention. It should be appreciated that these examples are provided for purposes of illustration only, and that the invention is not limited to the particular circuit shown in FIG. 8. Similar to FIG. 7, in FIG. 8 the current sampler 82A and the AC global offset adjust controller 76A are implemented in a circuit that performs both functions. In particular, in FIG. 8, R1 is a low value (e.g., 10 Ohm) resistor, and the voltage drop across R1 is a measure of the average current drawn by bolometers of the array. Capacitor C1 is a high frequency bypass for resistor R1. A high gain AC amplifier comprising C2, Q1, Q2, R2, R3 and R4 amplify the AC (instantaneous) component of the current drawn by a row of detectors coupled to the supply voltage $V_R$ 70. The amplified AC component is then detected by a synchronous rectifier comprising C3 and Q3. The output of the synchronous rectifier is integrated by AR1, R5, and C4. The output voltage of the integrator controls the current through resistor R6. Capacitor C6 is periodically reset to a high voltage at an appropriate time by an analog switch connected to the point labeled open_d. When the voltage at open_d is not applied, capacitor C6 discharges at a rate determined by the current through R6, thereby generating an essentially saw tooth waveform. The waveform generated by this process is then provided as an output 83 via transistor Q4, and ultimately is AC coupled into the summing node 84 shown in FIG. 6. The polarity of the feedback loop represented by the circuit in FIG. 8 is selected such that the AC component of the average current drawn by the bolometers from the supply voltage $V_R$ 70 is reduced to approximately zero during the initial bias time of the detectors, thereby compensating for the self-heating effects discussed above.

Figure 9:
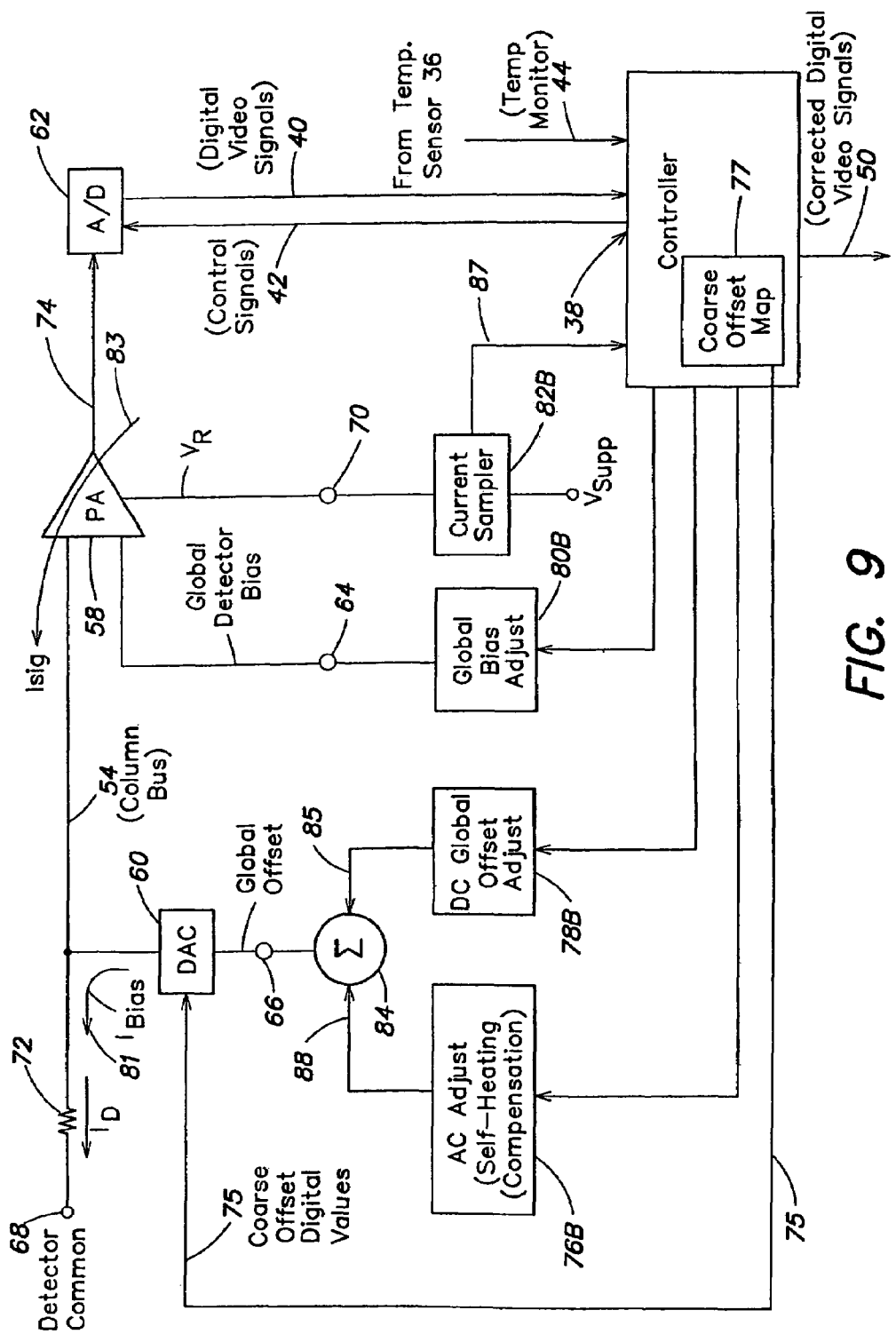
FIG. 9 is a diagram showing a more detailed view of the portion of the imaging system shown in FIG. 3, illustrating another implementation of various temperature compensation features, according to one embodiment of the invention.

FIG. 9 is a diagram similar to FIG. 6 showing a more detailed view of the portion of the imaging system shown in FIG. 3, illustrating another possible implementation of various temperature compensation features, according to one embodiment of the invention. In particular, FIG. 9 demonstrates some basic elements of one example of a primarily digital implementation for dynamic control of various operating parameters associated with a sensor.

In the embodiment of FIG. 9, essentially the controller 38 monitors various input signals and outputs various signals so as to implement closed feedback loop control of detector bias current and bias voltage in a manner similar to that discussed above in connection with FIG. 6. In particular, it should be appreciated that the controller 38 may pro- grammed in a variety of manners so as to execute one or more algorithms to implement such control. In one aspect of this embodiment, the controller 38 may include a number of analog-to-digital converters (not explicitly shown in FIG. 9) to digitize one or more signals input to the controller that are not already in digital form; for example, while the signals 40 received by the controller 38 from the A/D 62 are in digital form, the controller 38 may include one or more analog-to-digital converters to convert the output 87 from the current sampler 82B or the sensor temperature signal 44 to digital form. Similarly, according to one embodiment, the AC global offset adjust controller 76B, the DC global offset adjust controller 78B and the global bias adjust controller 80B each may include a digital-to-analog converter that receives digital output signals from the controller 38 and converts these signals to an analog voltage or current.

The embodiment of FIG. 9 provides a significantly versatile solution to feedback control of the various sensor operating parameters based on temperature variations of the sensor. For example, the controller 38 may monitor the average steady state temperature of the sensor by either monitoring the sensor temperature signal 44, the output 87 of the current sampler 82B, or periodically calculating an average detector output signal based on any number of the individually sampled digital detector output signals provided by the A/D 62, and monitoring any changes in this calculated signal. Any of these approaches may provide an input or "error signal" to the feedback loop. Additionally, the controller may monitor instantaneous changes in the current drawn by detectors of the sensor from the supply voltage $V_R$ 70 by sampling the output 87 of the current sampler 82B at an appropriate rate to acquire and store data related to detector self-heating.

Based on any of the foregoing sampled input signals, the controller 38 may flexibly control one or more of the AC global offset adjust controller 76A, the DC global offset adjust controller 78B and the global bias adjust 80B by merely outputting a digital value to these devices corresponding to the desired control. In particular, the controller 38 may be specifically programmed such that the DC global offset adjust controller dynamically maintains an appropriate bias current for the detectors based on measured temperature variations of the sensor, the global bias adjust controller 80B dynamically adjusts the global detector bias such that a product of the detector bias current and bias voltage remains essentially constant (so as to maintain an essentially constant detector power), and a timing and amplitude of a time-varying waveform generated by the AC global offset adjust controller 76B is dynamically adjusted based on the data acquired by sampling the output 87 of the current sampler 82B.

Figure 10:
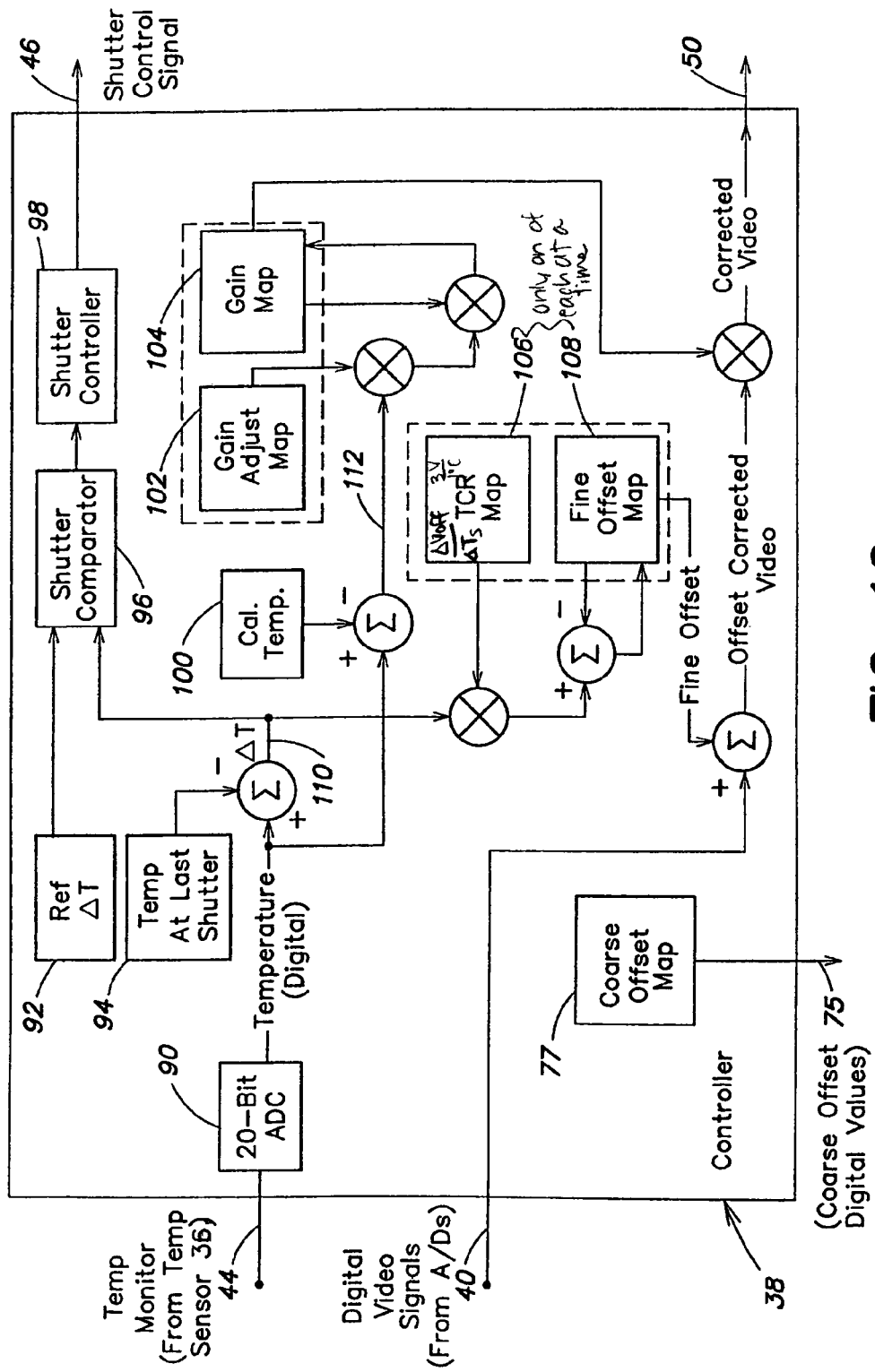
FIG. 10 is a block-diagram showing one example of a portion of a compensation algorithm implemented by a controller of the imaging system of FIG. 1, according to one embodiment of the invention.

FIG. 10 is a block diagram showing a more detailed view of a portion of the controller 38, illustrating one possible implementation of various temperature compensation features relating to calibration parameters associated with the sensor, according to one embodiment of the invention. In particular, FIG. 10 demonstrates some basic elements of one example of a calibration parameter compensation algorithm implemented by the controller 38. Of course, it should be appreciated that the invention is not limited to the algorithmic implementation outlined in FIG. 10, as other algorithmic implementations are possible, as discussed further below.

Prior Dynamic Calibration Methods

FIG. 10 illustrates an example of a dynamic calibration parameter adjustment algorithm based on linear approximations of offset and gain variation. According to the algorithm, an initial sensor calibration procedure is executed to obtain a number of calibration parameters related to a coarse offset error, a fine offset error, and a gain for each detector of a sensor. As illustrated in FIG. 10, these parameters are stored respectively in a coarse offset map 77, a fine offset map 108, and a gain map 104.

Additionally, during the calibration procedure, a number of adjustment values are determined that are used subsequently during normal operation to dynamically adjust at least some of the calibration parameters based on changes in sensor temperature. In particular, during the calibration procedure, according to one embodiment, a TCR (thermal coefficient of resistance) value and a gain adjustment factor is determined for each detector of a sensor as a linear approximation of offset error variation and gain variation, respectively. As also illustrated in FIG. 10, these adjustment values are stored respectively in a TCR map 106 and a gain adjust map 102.

Based on a particular temperature range over which it is anticipated that the sensor 32 will be operated, the sensor initially is thermally stabilized at a first temperature within this range, referred to as $T_{cal}$. Additionally, the shutter 26 shown in FIG. 1 may be positioned so as to essentially block radiation from a scene from impinging on the sensor 32 (i.e., the controller 38 may control the shutter control signal 46 to appropriately activate the shutter and block incident radiation). This event is referred to herein as a shutter operation. Alternatively, the sensor 32 may be aimed at a standardized radiating black body at a known temperature to provide a controlled input to the sensor 32.

Once the sensor is thermally stabilized with no input (i.e., shutter closed) or a controlled input, an initial global bias current and global bias voltage is applied to the sensor (e.g., via the global offset 66 and the global detector bias 64, common to all of the detectors), and the controller 38 begins to sequentially read digitized output values from each detector of the sensor via the A/Ds 62. Typically, many of the individual detector digitized output values initially are either significantly above or below a mid-scale value of the A/Ds 62. The variation in these outputs reflects the offset error of the individual detectors at the temperature $T_{cal}$. The controller 38 scans the sensor a number of times, and with each scan adjusts and applies a coarse offset digital value 75 for each detector (maintained in the coarse offset map 77) to an appropriate one of the DACs 60, so to adjust the individual detector bias current such that each detector output approximates a mid-scale value of the A/Ds 62. In this manner, the controller 38 executes a coarse offset calibration, or coarse "zeroing" of the sensor on an detector-by-detector basis. The final coarse offset digital values 75 that accomplish this coarse zeroing are stored in the coarse offset map 77. This process is referred to as "coarse" offset calibration because, according to one embodiment, the number of bits employed by the DACs 60 to make adjustments to the individual detector bias currents so as to bring the respective digitized detector output signals to approximately mid-scale of the A/Ds 62 typically is less than the number of bits used by the A/Ds 62 to digitize the amplified detector output signals.

Once the coarse offset calibration is completed, typically the individual detector signals are still not quite at a mid-scale value of the A/Ds 62. Accordingly, the controller 38 repeats the scanning process at $T_{cal}$ to compile a fine offset map 108, as shown in FIG. 10. Essentially, the controller 38 acquires several digital output samples from each detector (corrected for coarse offset) via the A/Ds 62, averages the samples, and stores this average as a calibration parameter for each detector in the fine offset map 108. During normal operation of the sensor (i.e., after the initial calibration procedure is completed), the respective fine offset values are used to make fine adjustments to the sampled digital outputs of corresponding detectors so as to further compensate for non-uniformities amongst the detectors.

Next, while the sensor temperature is still maintained at $T_{cal}$, the sensor 32 is aimed at a standardized black body radiating at a first known object temperature, $T_{obj1}$. Again, the controller 38 scans the array, applies the coarse and fine offset calibration parameters to each detector, and records the digitized output signal of each detector at $T_{obj1}$. Subsequently, the sensor 32 is aimed at a standardized black body radiating at a second known object temperature $T_{obj2}$, and the controller 38 again scans the array, applies the coarse and fine offset parameters to each detector, and records the digitized output signal of each detector at $T_{obj2}$. The controller 38 then calculates the gain of each detector by dividing the difference in digitized output signals of each detector at the two object temperatures by the difference in object temperatures $\Delta T_{obj}$, and stores this calibration parameter for the detector as an entry in the gain map 104 shown in FIG. 10. During normal operation (i.e., after the initial calibration procedure is completed), this gain value is used as a calibration parameter to make adjustments to the sampled digital output signals of the detector so as to further compensate for non-uniformities amongst the detectors.

At this point in the calibration procedure, the temperature $T_{cal}$ at which the sensor is initially stabilized is changed to a new temperature, $T_{cal2}$, so that the controller 38 may determine the adjustment factors (i.e., TCRs and gain adjustment factors) that are ultimately used as linear approximations of offset error variation and gain variation in the embodiment of FIG. 10 to compensate (e.g., dynamically adjust) the individual calibration parameters of the fine offset map 108 and the gain map 104 based on temperature variations of the sensor. It should be appreciated that offset error and gain for a given type of detector do not necessarily vary similarly with temperature variations of the sensor; for example, with respect to bolometers, offset error variation generally is significantly more sensitive than gain variation as a function of sensor temperature. Accordingly, the choice of a particular second sensor stabilization temperature $T_{cal2}$ for the calibration procedure may depend on the degree of accuracy desired by the linear approximations of offset error variation and gain variation for a given anticipated operating temperature range of the sensor. Notwithstanding the particular choice of $T_{cal2}$, the determination of the various (e.g., TCR and gain) adjustment factors may be understood conceptually as follows.

At $T_{cal2}$, the controller 38 repeats the procedure discussed above for obtaining fine offset values (i.e., with the shutter closed or with the sensor viewing a standardized black body radiating at a known temperature) to compile a new set of fine offset values at the sensor temperature $T_{cal2}$. The controller then calculates the TCR value for each detector by dividing the difference in fine offset values at $T_{cal}$ and $T_{cal2}$ for each detector by the temperature difference between $T_{cal}$ and $T_{cal2}$, and stores the TCR values for respective detectors in the TCR map 106 shown in FIG. 10. In this embodiment, each TCR value may be thought of conceptually in units of $\Delta V_{off}/\Delta T_S$, where $\Delta V_{off}$ represents the difference in fine offset values for a given detector, and $\Delta T_S$ indicates the variation in sensor temperature (i.e., $|T_{cal2}-T_{cal}|$).

Similarly, at $T_{cal2}$, the controller 38 repeats the procedure discussed above for obtaining gain values (i.e., using two standardized black bodies radiating at different known temperatures $T_{obj1}$ and $T_{obj2}$) to compile a new set of gain values at the sensor temperature $T_{cal2}$. The controller then calculates the gain adjustment factor for each detector by taking the ratio of the gain values at $T_{cal}$ and $T_{cal2}$, and dividing the ratio by the temperature difference between $T_{cal}$ and $T_{cal2}$.

This gain adjustment factor for each detector is then stored in the gain adjust map 102 shown in FIG. 10. In this embodiment, each gain adjustment factor of the gain adjust map 102 may be thought of conceptually as a gain multiplier divided by $|T_{cal2} - T_{cal}|$.

Once the controller 38 has completed building the various maps discussed above, the initial calibration procedure is essentially completed, and thereafter the imaging system may be operated without requiring thermal stabilization of the sensor 32. The controller 38 may dynamically update the calibration parameters of the fine offset map 108 using the corresponding TCR values of the TCR map 106, and may dynamically update the calibration parameters of the gain map 104 using the corresponding gain adjustment factors of the gain adjust map 102, by evaluating temperature variations of the sensor 32 based on a variety of criteria.

For example, the controller may periodically operate the shutter 26 via a shutter controller 98 (that outputs the shutter control signal 46) to block incident radiation to the sensor 32, at which time the controller recalculates (i.e., updates) each of the calibration parameters of the fine offset map 108 by scanning the sensor, as discussed above. In one aspect of this embodiment, the periodic operation of the shutter to perform this procedure may be based on a predetermined time interval. In yet another aspect, as illustrated in FIG. 10, the operation of the shutter may be based on a difference in sensor temperature from the last operation of the shutter.

More specifically, as illustrated in the embodiment of FIG. 10, the sensor temperature signal 44 output by the temperature sensor 36 shown in FIG. 1 is digitized by an analog-to-digital converter 90, and the controller 38 maintains a record 94 of the digitized sensor temperature at each shutter operation. The controller 38 also may be programmed with a predetermined threshold temperature difference value 92, which may be used to activate the shutter. In particular, in the embodiment of FIG. 10, the shutter comparator 96 compares the predetermined threshold temperature difference value 92 to the difference 110 ($\Delta T$) between the present digitized sensor temperature and the record 94 of the sensor temperature at the last shutter operation; if this difference 110 exceeds the value 92, the shutter comparator 96 activates the shutter controller 98 so as to operate the shutter 26, at which point the controller 38 updates the fine offset map 108 by scanning the sensor as discussed above. In this manner, the fine offset map 108 is periodically updated based on sensor temperature variations.

Based on the difference between a present sensor temperature and the sensor temperature at the previous shutter operation, the controller 38 may adjust and update both the fine offset map 108 and the gain map between shutter operations (i.e., between updates of the fine offset map 108 by a sensor rescan). For example, as illustrated in FIG. 10, the temperature difference 110 between the present sensor temperature and the sensor temperature at the previous shutter operation may be used to multiply individual entries of the TCR map 106, which are then used to update the individual entries in the fine offset map 108. Similarly, a signal 112 representing the difference between the present sensor temperature and the calibration temperature 100 (i.e., $T_{cal}$) may be used to multiply individual entries of the gain adjust map 102, which are then used to update the individual entries in the gain map 104.

Real-Time Calibration Methods and Apparatus

As discussed above, calibration parameters associated with a sensor may be dynamically adjusted as a function of sensor temperature to compensate for changes in the operational characteristics of the sensor due to temperature variations of the sensor. In the calibration procedure discussed above, the dynamic adjustment is based on linear approximations of offset error variation and gain variation, determined during an initial calibration procedure, and updates of an offset map, determined during periodic shutter operations.

Applicants have appreciated that calibration operations may be performed in an imaging system without generating linear approximations of offset error variation and gain variation in an initial sensor calibration procedure. In particular, Applicants have appreciated that offset error variation and gain variation may be determined during operation of a camera, without the requirement of factory calibration conditions (e.g., a particular calibration temperature or a radiating black body). One benefit associated with determining offset error variation and gain variation during operation of a camera is that the initial sensor calibration procedure need only be performed using a single calibration temperature, whereas the generation of linear approximations requires at least two calibration temperatures. Performing the initial calibration procedure using one temperature saves the cost and time associated with performing a factory calibration procedure at one or more additional calibration temperatures. Another benefit associated with determining offset error variation and gain variation during operation of a camera is the ability to reduce the frequency of shutter operations to recompute the fine offset table.

In view of the foregoing, one embodiment of the invention is directed to performing an initial sensor calibration procedure using a single calibration temperature. In one example, a coarse offset map, fine offset map, and gain map are generated using a chosen calibration temperature prior to normal operation of the imaging system (e.g., in the factory after manufacture of the sensor). The exemplary procedure set forth above (in reference to FIG. 10) for generating coarse offset map 77, fine offset map 108, and gain map 104 may be used to create one or more maps during an initial sensor calibration procedure prior to the calibration procedures described below. In other examples, the initial calibration procedure may be performed for a plurality of calibration temperatures, or the initial calibration procedure may be eliminated entirely.

One potential benefit of performing an initial calibration procedure is to account for all portions of the gain and offset of a pixel that do not change with temperature. One example of an operating characteristic that does not change appreciably with temperature is optical gain, which may be caused by a lens and/or window positioned between one or more pixels and the scene. Another example is the electrical gain and offset of the sensor read-out circuitry, which does not change appreciably with temperature. In contrast, the portions of the gain and offset of a pixel that are attributable to the physical properties of the pixel change with temperature. Accordingly, by calibrating each pixel during an initial sensor calibration procedure, the portions of the gain and offset that do not change with temperature can be isolated and removed from the output signals of the pixels.

Figure 11:
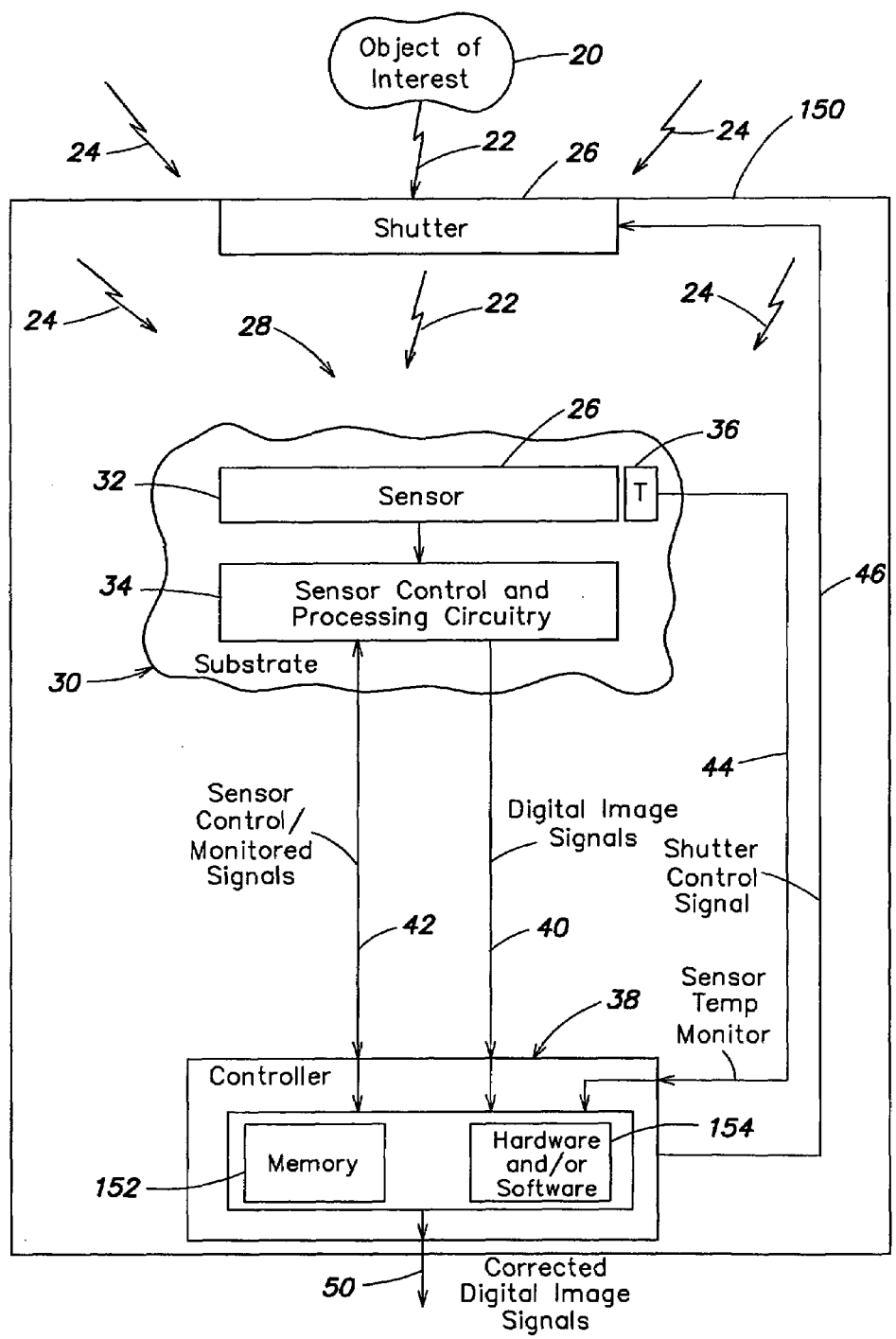
FIG. 11 is a diagram showing a portion of an imaging system according to another embodiment of the invention.

According to one aspect of the invention, the sensor of the imaging system is not temperature controlled, such that the temperature within the imaging system during a shutter operation (i.e., the ambient temperature) is the same as the temperature of a substrate on which the sensor is formed. The temperature of the substrate may be measured using a temperature sensor coupled to the substrate. In one example, the temperature within the imaging system is also the same as the temperature of the sensor itself and/or individual pixels of the sensor during the shutter operation. FIG. 11 shows one example of an imaging system 150 according to the present embodiment. The imaging system 150 includes the same basic components as the imaging system shown in FIG. 1, but excludes TE cooler 28. Without temperature control, pixels of the imaging system may track ambient temperature, such that the temperature of the pixels attributable to ambient temperature may be measured and accounted for.

One embodiment of the invention is directed to the generation of one or more gain calibration parameters after an initial sensor calibration procedure (i.e., during regular operation of the imaging system). According to one exemplary implementation, a gain calibration parameter is generated based on first and second temperatures of the sensor and corresponding first and second resistances of a pixel of the sensor, all measured without the incidence of scene radiation to the pixel. In one example, the first temperature and first resistance may be measured during a first shutter operation and the second temperature and second resistance may be measured during a second shutter operation. The first and second temperatures of the sensor may be based on first and second temperatures of a substrate coupled to the sensor, which may be assumed to be at the same temperature as the sensor.

A further embodiment of the invention is directed to the generation of one or more offset calibration parameters after the initial sensor calibration procedure using, in part, a temperature of the sensor when exposed to both ambient and scene radiation. According to one exemplary implementation, an offset calibration parameter is generated based on a gain value for a pixel, together with a temperature of the sensor, wherein the temperature is measured during the incidence of scene radiation to the pixel. To determine the change in temperature of the pixel due solely to scene radiation, the offset calibration parameter may be applied to a resistance of the pixel measured when the pixel is exposed to both ambient and scene radiation. In one example, the temperature and resistance may be measured during the acquisition of image data by the sensor. The temperature of the sensor may be based on a temperature of a substrate coupled to the sensor, which may be assumed to be at the same temperature as the sensor.

Exemplary implementations of a gain calibration procedure and an offset calibration procedure in accordance with the invention are described below. It should be appreciated, however, that these exemplary implementations are provided for purposes of illustration only, and that the invention is not limited in this respect.

The temperature of a pixel based on scene radiation alone ($T_{x(scene)}$) may be expressed in terms of gain, offset, and the resistance of the pixel ($R_x$), as shown in Equation 1, below:

$$T_{x(scene)} = (Gain)(R_x) + \text{Offset} \qquad \text{Equation [1]}$$

As illustrated by Equation 1, the gain and offset of a pixel may be used as calibration parameters to compensate for the gain and offset error of a pixel, such that the temperature of the pixel based on scene radiation may be determined. In particular, a gain of a pixel may be multiplied by a resistance value of the pixel, measured at time x, to generate a temperature value of the pixel at time x that is corrected for gain error. An offset of a pixel may be added to the term $(Gain)(R_x)$, to generate a temperature value of the pixel at time x that is corrected for both offset and gain. In other words, if the resistance value of the pixel at time x is multiplied by the gain and the result is added to the offset, a temperature of the pixel at time x attributable solely to scene radiation can be determined. Although the gain and offset parameters are used above to adjust an output signal of a pixel (i.e., a resistance value of the pixel), the invention is not limited in this respect. In particular, according to another embodiment of the invention, the gain and/or offset parameters may be used to adjust an operating parameter (e.g., a DC bias current or a bias voltage) of the sensor that affects the signal output from the pixel, as discussed previously herein.

The gain of a pixel over a period of time from n−1 to n is expressed by Equation 2, where $T_{n-1}$ and $T_n$ are temperature values at first and second times, respectively, and $R_{n-1}$ and $R_n$ are resistance values at first and second times, respectively:

$$(Gain)_{n-1 \to n} = \left[\frac{R_n - R_{n-1}}{T_n - T_{n-1}}\right] \qquad \text{Equation [2]}$$

Thus, the gain of a pixel over a period of time may be expressed as the change in resistance of the pixel per change in temperature of the pixel over the period of time. As discussed previously, the gain of each pixel in a sensor may change as the temperature of the sensor varies. Additionally, the change in pixel gain due to a change in sensor temperature may be different from pixel to pixel.

Figure 12:
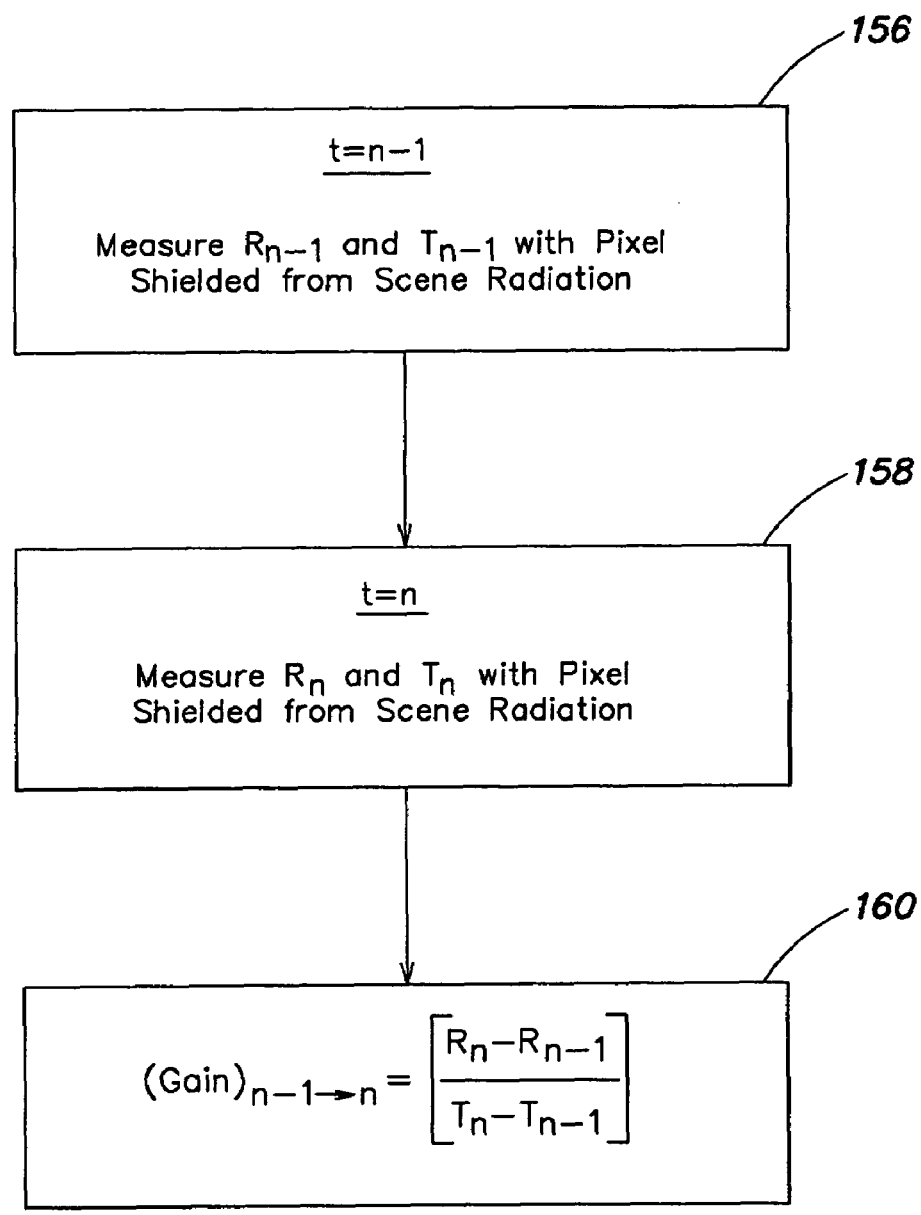
FIG. 12 is a flow diagram illustrating an exemplary method for calculating a gain calibration parameter according to one embodiment of the invention.

To calculate the gain of a pixel over a period of time due to changes in ambient temperature alone, the following exemplary procedure may be used, illustrated in FIG. 12. As shown in steps 156 and 158 of FIG. 12, the pixel may be blocked from scene radiation at times n−1 and n (e.g., via shutter operations) such that the pixel is exposed only to ambient temperature at those times. The ambient temperature can be measured using a temperature sensor in proximity to the pixel. For example, the temperature sensor may be coupled to a substrate supporting the pixel, and may detect a temperature thereof. As discussed previously, the temperature of the substrate may track ambient temperature changes, and therefore may be assumed to be equivalent or substantially equivalent to the ambient temperature and/or the temperature of the pixel. In addition to pixel temperature, the resistance of the pixel is also measured at times n−1 and n to determine the resistance of the pixel that is attributable to the ambient temperature at times n−1 and n. Finally, as shown in step 160 of FIG. 12, the measured values for the resistance of the pixel at times n−1 and n and the substrate temperature at times n−1 and n may be inserted for the variables $R_{n-1}$, $R_n$, $T_{n-1}$, and $T_n$, respectively, in Equation 2 to calculate the gain of the pixel between n−1 and n.

A parameter related to the gain of a pixel is the thermal coefficient of resistance (TCR) of a pixel. The TCR of a pixel over a period of time from n−1 to n is expressed by Equation 3, below:

$$TCR_{n-1 \to n} = \frac{1}{R_n}\left[\frac{R_n - R_{n-1}}{T_n - T_{n-1}}\right] \qquad \text{Equation [3]}$$

The TCR of a pixel may be considered as the percentage change in the resistance of the pixel per degree change in sensor temperature over the time period for which it is calculated. If the TCR of a pixel is calculated using a temperature change and resistance change of the pixel without the influence of scene radiation, the gain error of the pixel can be determined from the TCR. Further, the TCR value calculated above for the period between n−1 and n may be used to find the change in resistance due to ambient temperature change throughout any temperature change for which the actual TCR remains substantially linear. The TCR of a pixel may be calculated using the steps outlined above for the calculation of gain, and multiplying the calculated gain value by $1/R_n$.

The calculated TCR for each pixel may be used as a gain coefficient to correct for gain error of each pixel. Accordingly, after each shutter operation, a new gain map may be generated based on the calculated TCRs. As discussed above, the TCR of the pixel is calculated using a temperature change and resistance change of the pixel due solely to ambient temperature drift. The TCR of a pixel, though calculated for the time period between n−1 and n, may closely approximate the gain at another time x, e.g., if the temperature change between time n and time x is relatively small. Accordingly, the TCR calculated for one time period may also be applied for another time period having a different temperature fluctuation.

According to another embodiment of the invention, the TCR of a pixel may be updated without performing a shutter operation using a known relationship between temperature and TCR. Equation 4, below, shows one calculation that may be performed to calculate a new TCR value based on a change in temperature, where $TCR_n$ is the TCR value calculated for time n, $TCR_x$ is the interpolated TCR value for time x, and $\Delta T_{n \to x}$ is the change in temperature from time n to time x:

$$TCR_x = \frac{TCR_n}{(\Delta T_{n \to x})^2} \qquad \text{Equation [4]}$$

As may be appreciated from the equation, an updated TCR value for each pixel may be interpolated using a temperature measurement of the pixel without the need for an associated resistance measurement. In this manner, the TCR of one or more pixels of a sensor may be updated between shutter operations. According to one example, the TCR of one or more pixels may be updated at every frame.

According to another embodiment of the invention, the offset resistance of a pixel can be determined without blocking incident radiation to the pixel, e.g., via a shutter operation. This may be accomplished by separately accounting for the change in resistance since the last shutter operation attributable to a drift in substrate temperature, and the change in resistance since the last shutter operation attributable to scene-based radiation. Equation 5, below, describes the change in resistance of a pixel from time n to time x ($\Delta R_{n \to x}$) as equaling the change in the resistance due to scene radiation ($\Delta R_{n \to x(scene)}$) plus the change in resistance due to substrate drift ($\Delta R_{n \to x(sub)}$):

$$\Delta R_{n \to x} = \Delta R_{n \to x(scene)} + \Delta R_{n \to x(sub)} \qquad \text{Equation [5]}$$

In addition, as expressed in Equation 6, the change in resistance of a pixel from time n to time x ($\Delta R_{n \to x}$) equals the resistance of the pixel at time x ($R_x$) minus the resistance of the bolometer at time n ($R_n$):

$$\Delta R_{n \to x} = R_x - R_n \qquad \text{Equation [6]}$$

Similarly, as expressed in Equation 7, the change in temperature of the pixel attributable to substrate drift between time n and time x ($\Delta T_{n \to x(sub)}$) equals the substrate temperature at time x ($T_{x(sub)}$) minus the substrate temperature at time n ($T_n$):

$$\Delta T_{n \to x(sub)} = T_{x(sub)} - T_n \qquad \text{Equation [7]}$$

Using Equation 1, the portion of the change in the resistance of the pixel that is generated by substrate temperature drift can be solved for. To do so, $\Delta R_{n-1 \to n}$ in Equation 1 can be solved for, then $\Delta T_{n-1 \to n(sub)}$ can be substituted for $\Delta T_{n \to x(sub)}$ and $\Delta R_{n-1 \to n(sub)}$ can be substituted for $\Delta R_{n \to x(sub)}$. The TCR calculated for the period between n−1 and n may be used to relate the change in substrate temperature between n and x to the change in resistance due to substrate temperature drift between n and x if the time lapse is within a determined acceptable range, or if the temperature change from time n to time x is within an acceptable range (e.g., 10° C.), for example. The predetermined acceptable ranges for time lapse and temperature change may be based on the range of such time lapses or temperature changes for which the previously calculated TCR will closely approximate the actual TCR. Equation 8, below, expresses the change in the resistance of the pixel generated between time n and x by substrate temperature drift:

$$\Delta R_{n \to x(sub)} = (TCR_{n-1 \to n})(\Delta T_{n \to x(sub)})(R_n) \qquad \text{Equation [8]}$$

To calculate the change in temperature of the pixel between time n and time x attributable solely to scene radiation, $\Delta T_{n \to x(sub)}$ can be solved for in Equation 7 above. Further, $\Delta T_{n \to x(sub)}$ and $\Delta R_{n \to x(sub)}$ can be substituted for $\Delta T_{n \to x(scene)}$ and $\Delta R_{n \to x(scene)}$, respectively, since the relationship between the change in pixel temperature and the change in pixel resistance is the same, whether the change is attributable to a change in scene temperature or substrate temperature. The change in temperature of the pixel between time n and time x attributable solely to scene radiation is expressed by Equation 9 below.

$$\Delta T_{n \to x(scene)} = \frac{\Delta R_{n \to x(scene)}}{(TCR_{n-1 \to n})(R_n)} \qquad \text{Equation [9]}$$

Equation 8 can be rewritten in terms of known values via a series of substitutions, shown in Equations 9–13 below. First, in Equation 10, the denominator of Equation 9 is assigned a value An to simplify Equations 11–14.

$$A_n = (TCR_{n-1 \to n})(R_n) = \frac{R_n - R_{n-1}}{T_n - T_{n-1}} \qquad \text{Equation [10]}$$

In Equation 11, the numerator of Equation 8 is rewritten by solving for $\Delta R_{n \to x(scene)}$ in Equation 4. The denominator of Equation 9 is substituted for $A_n$ using Equation 10.

$$\Delta T_{n \to x(scene)} = \frac{\Delta R_{n \to x} - \Delta R_{n \to x(sub)}}{A_n} \qquad \text{Equation [11]}$$

In Equation 12, the numerator is rewritten using Equations 6 and 8. In particular, $\Delta R_{n \to x}$ is rewritten by substituting the right-hand portion of Equation 6, and $\Delta R_{n \to x(sub)}$ is rewritten by substituting the right-hand portion of Equation 8.

$$\Delta T_{n \to x(scene)} = \frac{R_x - R_n - (TCR_{n-1 \to n})(\Delta T_{n \to x(sub)})(R_n)}{A_n} \quad \text{Equation [12]}$$

Equation 12 is further rewritten using Equation 3 to substitute $TCR_{n-1 \to n}$ for $A_n/R_n$, and Equation 7 to substitute for $\Delta T_{n \to x(sub)}$ for $(T_{x(sub)} - T_n)$.

$$\Delta T_{n \to x(scene)} = \frac{R_x - R_n - \left[\frac{1}{R_n}(A_n)\right](T_{x(sub)} - T_n)(R_n)}{A_n} \quad \text{Equation [13]}$$

Finally, Equation 13 is simplified by canceling $R_n/R_n$ in the numerator, which results in Equation 14.

$$\Delta T_{n \to x(scene)} = \frac{R_x - R_n - A_n(T_{x(sub)} - T_n)}{A_n} \quad \text{Equation [14]}$$

The expression given by Equation 14 represents the change in temperature of a pixel caused by scene radiation alone. In other words, Equation 14 represents the change in temperature of a pixel corrected for offset and gain error, and applies the net effect of the corrections discussed in connection with Equations 1 and 2 (above) and Equation 15 (below). By applying Equation 14 to each pixel of a sensor, the image generated by the sensor can be corrected for offset and gain. In one example, the correction is performed after a certain time lapse or temperature change. In another example, only a portion of the sensor, e.g., 10% of the pixels of a sensor, is corrected for offset and gain during a given frame. Performing such correction in portions may conserve memory and processing resources. In a further example, an offset and/or gain calibration operation is performed for each pixel of the sensor at each frame.

Equation 14 allows both gain and offset error to be corrected using one calculation. However, it may be desirable to separately correct for gain and offset error. One method for correcting gain without correcting offset was described in reference to Equations 1–2. A method for correcting offset without correcting gain will now be described in reference to Equations 1 and 15. Equation 15, which may be derived from Equations 1 and 14, describes the offset of a pixel at time x as follows:

$$(Offset)_x = 2T_n - T_{x(sub)}\left[\frac{R_n(T_n - T_{n-1})}{R_n - R_{n-1}}\right] \quad \text{Equation [15]}$$

Figure 13:
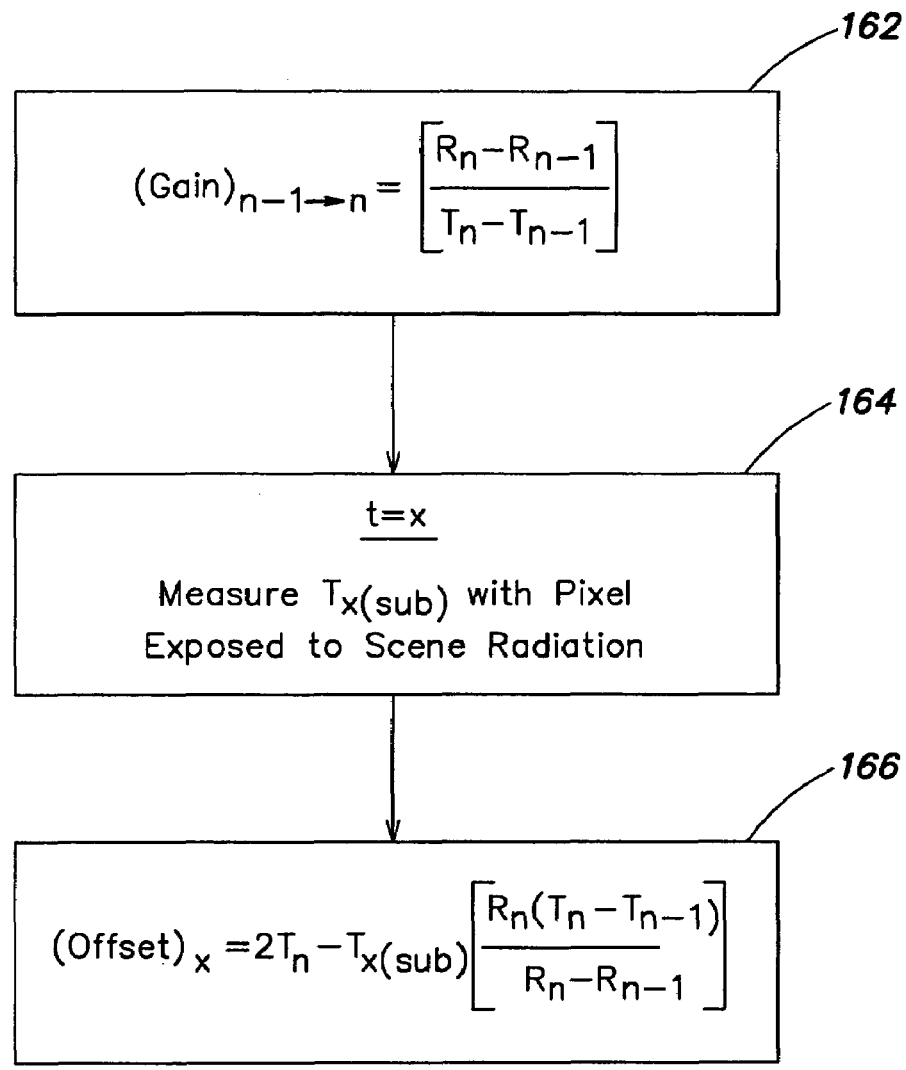
FIG. 13 is a flow diagram illustrating an exemplary method for calculating an offset calibration parameter according to one embodiment of the invention.

The offset calibration parameter above may be applied to the measured resistance of the pixel at time x ($R_x$) to compensate for an offset error of the pixel. In particular, as discussed in reference to Equation 1, the offset of a pixel, which may be expressed in terms of degrees, may be added to the temperature value of a pixel corrected for gain error (i.e., (Gain)($R_x$)). Accordingly, Equations 1 and 15 may be used to correct an offset error of a pixel separate from gain error. FIG. 13 illustrates an exemplary procedure for correcting offset error using a previously calculated gain of the pixel, shown in step 162. As discussed above, after determination of the gain of the pixel (e.g., using shutter operations), the pixel may be exposed to scene radiation and an ambient temperature of the pixel may be measured (step 164). Using these measurements, together with a gain value of the pixel, the variables of Equation 15 may be substituted for the corresponding measured values and offset may be calculated (step 166).

It should be appreciated that the generated calibration data (e.g., offset and gain calibration parameters) may be used to compensate for gain and offset error of pixels of a sensor in a number of ways. For example, as discussed above, the calibration data may be used to adjust output signals (e.g., resistance or temperature) of pixels of the sensor to compensate for temperature variations of the sensor that are not due to radiation of interest. Alternatively, the calibration data may be used to adjust operating parameters (e.g., a DC bias current of the sensor or a bias voltage) of pixels of the sensor. The calibration data may be stored in one or more offset and gain maps, which may be updated based on temperature variations of the sensor on a pixel by pixel basis. In another example, offset and gain maps may be generated for a plurality of different temperatures.

According to one embodiment of the invention, the calibration data (e.g., offset and gain calibration parameters) corresponding to a particular temperature is stored so that it may be used again when the sensor experiences the same or similar temperature conditions. Storing calibration data and reusing it under the same or similar temperature conditions reduces the number of calibration procedures required. According to another embodiment of the invention, the calibration data corresponding to a particular temperature is updated periodically, based on the occurrence of a particular event. For example, the calibration procedure may be repeated every third time the same or similar temperature conditions are detected, although other sequences may also be used.

According to a further embodiment of the invention, the imaging system may self-calibrate itself over the entire range of operating temperatures during an initial self-calibration period. For example, the imaging system may be placed in a chamber that is controlled to vary the temperature within the chamber over the range of operating temperatures of the imaging system. By initially exposing the imaging system to its full range of operating temperatures and allowing the system to perform a self-calibration procedure at each temperature, the system can be fully calibrated before regular use.

According to another embodiment of the invention, the calibration procedures described above may be initiated based on the occurrence or existence of some condition, such as a temperature, time, or power-on of the system. The calibration procedure may also be initiated based on a change in such a condition, e.g., a time lapse or increase or decrease in temperature.

The above-described embodiments of the present invention can be implemented in any of numerous ways. Initially, while the detectors of the sensor are generically referred to as pixels above, it should be appreciated that the pixels may be implemented as bolometers and/or other types of detectors described herein. In one example, the pixels of the sensor are configured as an array. Further, the above-discussed calibration procedures can be implemented using hardware, software, or any combination thereof. The hardware and/or software may be housed within the imaging system, for example in controller 38 of FIG. 11 as hardware/software 154. When implemented in software, the software code can be executed on any suitable processor or processors. It should further be appreciated that any single component or collection of multiple components that perform the calibration functions described above can be generically considered as one or more controllers that control the above-discussed functions. The one or more controllers can be implemented in numerous ways, such as with dedicated hardware, or using a processor that is programmed using microcode or software to perform the functions recited above.

In this respect, it should be appreciated that one implementation of the embodiments described above comprises at least one memory device (e.g., magnetic media such as hard disks, floppy disks, and magnetic tape; optical media such as CD-ROMs and holographic devices; magneto-optical media such as optical disks; and hardware devices that are specially configured to store and execute program code, such as application-specific integrated circuits (ASICs), programmable logic devices (PLDs) and read only memory (ROM) and random access memory (RAM) devices, etc.) encoded with a program (i.e., a plurality of instructions), which, when executed on a processor, performs the above-discussed calibration functions of embodiments of the present invention. The at least one memory device may also be used to store data measured during calibration procedures. The memory device can be transportable such that the program stored thereon can be loaded onto an imaging system to implement the aspects of the present invention discussed herein. One exemplary memory device is shown as memory 152 in FIG. 11. The term computer program is used herein in a generic sense to reference any type of computer code (e.g., software or microcode) that can be employed to program a processor to implement the above-discussed aspects of the present invention.

Having thus described at least one illustrative embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. An imaging apparatus, comprising:
    a plurality of pixels to detect radiation and to output image signals based on the detected radiation;
    a temperature sensor to detect an ambient temperature; and
    means, coupled to the plurality of pixels and the temperature sensor, for determining a calibration parameter of a pixel during operation of the imaging apparatus, based on at least a first ambient temperature of the pixel and a second ambient temperature of the pixel, each measured after an initial calibration procedure.

2. The imaging apparatus of claim 1, wherein the means for determining a calibration parameter comprises means for determining an offset of the pixel.

3. The imaging apparatus of claim 1, wherein the means for determining a calibration parameter comprises means for determining a gain of the pixel.

4. The imaging apparatus of claim 1, wherein the means for determining a calibration parameter is actuated to determine the calibration parameter when a predetermined time period has elapsed.

5. The imaging apparatus of claim 1, wherein the means for determining a calibration parameter is actuated to determine the calibration parameter when a predetermined ambient temperature change has occurred.

6. The imaging apparatus of claim 1, wherein the means for determining a calibration parameter comprises at least one processor, and wherein the at least one processor is programmed to perform an act of:
    calculating an offset calibration parameter for the pixel based on a change in resistance of the pixel over a time period and a change in the ambient temperature of the pixel over the time period.

7. The imaging apparatus of claim 6, wherein the offset calibration parameter is a change in a resistance of the pixel caused by a change in an ambient temperature of the pixel.

8. The imaging apparatus of claim 1, wherein the plurality of pixels are sensitive to radiation in the infrared range.

9. The imaging apparatus of claim 1, wherein the plurality of pixels are sensitive to thermal radiation.

10. The imaging apparatus of claim 1, wherein the means for determining includes means for determining the calibration parameter after an initial calibration procedure during which calibration is performed at only one calibration temperature.

11. A method of calibrating an imaging system comprising a thermal sensor, comprising an act of:
    determining a calibration parameter of a pixel of the thermal sensor during operation of the imaging apparatus, based on at least a first ambient temperature of the pixel and a second ambient temperature of the pixel, each measured after an initial calibration procedure.

12. The method of claim 11, wherein the act of determining a calibration parameter includes comparing first and second output signals of the pixel.

13. The method of claim 12, wherein the act of determining a calibration parameter further includes comparing first and second temperature signals associated with the first and second output signals.

14. The method of claim 11, wherein the act of determining a calibration parameter includes determining an offset calibration parameter of the pixel.

15. The method of claim 14, wherein the act of determining an offset calibration parameter includes determining a change in resistance of the pixel over a time period and a change in the ambient temperature of the pixel over the time period.

16. The method of claim 11, wherein the act of determining a calibration parameter includes determining a gain calibration parameter of the pixel.

17. The method of claim 11, wherein the act of determining a calibration parameter occurs when a predetermined time period has elapsed.

18. The method of claim 11, wherein the act of determining a calibration parameter occurs when a predetermined ambient temperature change has occurred.

19. The method of claim 11, wherein the act of determining a calibration parameter includes determining a calibration parameter of a pixel sensitive to infrared radiation.

20. The method of claim 11, wherein the act of determining includes determining the calibration parameter after an initial calibration procedure during which calibration is performed at only one calibration temperature.

21. The method of claim 16, wherein the act of determining a gain calibration parameter of the pixel comprises acts of:
    shielding the pixel from scene radiation at a first time and measuring a resistance of the pixel and an ambient temperature at the first time;
    shielding the pixel from scene radiation at a second time and measuring a resistance of the pixel and an ambient temperature at the second time;

calculating a first gain calibration parameter using the resistance of the pixel and the ambient temperature at the first time and the resistance of the pixel and the ambient temperature at the second time; and determining a second gain calibration parameter for the pixel.

22. The method of claim 21, wherein the act of calculating the first gain calibration parameter includes determining a change in the resistance of the pixel between the first and second times relative to a change in the ambient temperature between the first and second times.

23. The method of claim 22, wherein the act of calculating the first gain calibration parameter further comprises acts of:
subtracting the ambient temperature at the first time from the ambient temperature at the second time to generate an ambient temperature difference;
subtracting the resistance of the pixel at the first time from the resistance of the pixel at the second time to generate a resistance difference; and
dividing the ambient temperature difference by the resistance difference.

24. The method of claim 21, wherein:
the act of shielding the pixel from scene radiation at the first time comprises performing a shutter operation at the first time; and
the act of shielding the pixel from scene radiation at the second time comprises performing a shutter operation at the second time.

25. The method of claim 21, wherein the act of determining a second gain calibration parameter for the pixel comprises acts of:
shielding the pixel from scene radiation at a third time and measuring a resistance of the pixel and an ambient temperature at the third time; and
calculating a second gain calibration parameter using the resistance of the pixel and the ambient temperature at the second time and the resistance of the pixel and the ambient temperature at the third time;
wherein the method further comprises an act of updating the gain calibration parameter with the second gain calibration parameter.

26. The method of claim 21, wherein the pixel is a first pixel in an array of pixels, and wherein the method further comprises:
measuring a resistance of a second pixel in the array of pixel at the first time;
measuring a resistance of the second pixel at the second time; and
calculating a gain calibration parameter for the second pixel using the resistance of the second pixel at the first and second times and the ambient temperature at the first and second times.

27. The method of claim 21, wherein:
the act of measuring the ambient temperature at the first time comprises measuring a substrate temperature at the first time;
the act of measuring the ambient temperature at the second time comprises measuring a substrate temperature at the second time; and
the act of calculating the first gain calibration parameter comprises calculating the first gain calibration parameter using the resistance of the pixel at the first and second times and the substrate temperature at the first and second times.

28. A method of claim 21, further comprising acts of:
receiving scene radiation via the pixel at a third time and measuring an ambient temperature at the third time;

calculating a second gain calibration parameter using the ambient temperature at the third time and a predetermined function that relates an ambient temperature change to a gain calibration parameter change; and
updating the gain calibration parameter with the second gain calibration parameter.

29. The method of claim 21, wherein the pixel is a first pixel in an array of pixels, and wherein the method further comprises acts of:
shielding a second pixel of the array from scene radiation at a first time and measuring a resistance of the second pixel at the first time;
shielding the second pixel from scene radiation at a second time and measuring a resistance of the second pixel at the second time; and
calculating a gain calibration parameter for the second pixel using the resistance of the second pixel and the ambient temperature at the first time and the resistance of the second pixel and the ambient temperature at the second time.

30. The method of claim 21, further comprising an act of:
applying the second gain calibration parameter to correct a gain error of the pixel.

31. The method of claim 30, wherein the act of applying includes applying the second gain calibration parameter to an output signal of the pixel to correct the gain error of the pixel.

32. The method of claim 30, wherein the act of applying includes applying the second gain calibration parameter to an operating parameter of the pixel to correct the gain error of the pixel.

33. The imaging apparatus of claim 1, further comprising:
a data storage device to store first and second ambient temperature values and first and second resistance values for each pixel of the plurality of pixels;
wherein the means for determining a calibration parameter comprises:
means for calculating a first gain calibration parameter for each pixel of the plurality of pixels using the first and second ambient temperature values and first and second resistance values for each pixel of the plurality of pixels; and
means for determining a second gain calibration parameter for each pixel of the plurality of pixels.

34. The imaging apparatus of claim 33, further comprising:
a shutter mechanism to block scene radiation;
wherein the first and second ambient temperature values and first and second resistance values for each pixel of the plurality of pixels are each detected during actuation of the shutter mechanism.

35. The imaging apparatus of claim 33, further comprising:
a substrate coupled to the plurality of pixels;
wherein the temperature sensor is thermally coupled to the substrate so as to detect a temperature of the substrate.

36. The imaging apparatus of claim 33, wherein the plurality of pixels are sensitive to radiation in the infrared range.

37. The imaging apparatus of claim 33, wherein the plurality of pixels are sensitive to thermal radiation.

38. The imaging apparatus of claim 33, wherein at least some of the plurality of pixels are bolometers.

39. A method of calculating an offset calibration parameter of a pixel of a camera, comprising acts of:

determining a gain of the pixel during a period of operation of the camera between first and second times, after an initial calibration procedure;

exposing the pixel to both scene and ambient radiation at a third time;

measuring an ambient temperature of the pixel at the third time; and calculating the offset calibration parameter of the pixel using the gain of the pixel between the first and second times and the ambient temperature of the pixel at the third time.

40. The method of claim 39, further comprising an act of:

determining a portion of a change in temperature of the pixel between the second and third times based solely on a change in scene radiation using the offset calibration parameter and a resistance of the pixel measured at the third time.

41. The method of claim 40, further comprising an act of:

determining the portion of a change in temperature of the pixel between the second and third times based solely on a change in scene radiation by multiplying a gain calibration parameter by the resistance of the pixel measured at the third time to generate a product, and adding the offset calibration parameter to the product.

42. The method of claim 39, wherein the act of calculating the offset calibration parameter includes an act of determining the portion of the resistance of the pixel at the third time that is attributable to ambient radiation.

43. The method of claim 39, further comprising acts of:

shielding the pixel from scene radiation at the first and second times; and exposing the pixel to ambient radiation and scene radiation at the third time.

44. A method of claim 43, wherein the act of shielding comprises performing a shutter operation at the first and second times.

45. The method of claim 39, wherein the act of determining a gain of the pixel comprises acts of:

shielding the pixel from scene radiation at a first time and measuring a resistance of the pixel and an ambient temperature at the first time;

shielding the pixel from scene radiation at a second time and measuring a resistance of the pixel and an ambient temperature at the second time; and calculating the gain of the pixel using the resistance of the pixel and the ambient temperature at the first time and the resistance of the pixel and the ambient temperature at the second time.

46. The method of claim 39, wherein the pixel is a first pixel in an array of pixels, and wherein the method further comprises:

determining a gain of a second pixel in the array between the first and second times;

measuring a resistance of the second pixel; and calculating a change in the resistance of the second pixel between the second time and the third time resulting from a change in the ambient temperature between the second time and the third time.

47. The method of claim 39, wherein:

the act of measuring an ambient temperature of the pixel at a third time comprises measuring a substrate temperature at the third time.

48. The method of claim 39, further comprising an act of:

applying the offset calibration parameter to an output signal of the pixel at the third time to correct an offset error of the pixel.

49. The method of claim 48, wherein the act of applying includes applying the offset calibration parameter to a resistance of the pixel at the third time to correct the offset error of the pixel.

50. The method of claim 48, wherein the act of applying includes applying the offset calibration parameter to an operating parameter of the pixel to correct the offset error of the pixel.

51. An imaging apparatus, comprising:

at least one pixel to detect radiation and to output image signals based on the detected radiation;

a temperature sensor to detect an ambient temperature; and means for calculating an offset calibration parameter for the at least one pixel using a gain of the at least one pixel during a period of operation of a camera between first and second times after an initial calibration procedure, and an ambient temperature at a third time, wherein the pixel is exposed to both scene and ambient radiation at the third time.

52. The imaging apparatus of claim 51, further comprising:

a substrate coupled to the at least one pixel;

wherein the temperature sensor thermally coupled to the substrate so as to detect a temperature of the substrate.

53. The imaging apparatus of claim 51, wherein the at least one pixel is sensitive to radiation in the infrared range.

* * * * *